(12) United States Patent
Hung et al.

(10) Patent No.: US 10,962,424 B2
(45) Date of Patent: Mar. 30, 2021

(54) MICRO-ELECTRO-MECHANICAL SYSTEM (MEMS) THERMAL SENSOR

(71) Applicant: Taiwan Semiconductor Manufacturing Co., Ltd., Hsinchu (TW)

(72) Inventors: Tsai-Hao Hung, Hsinchu (TW); Shih-Chi Kuo, Yangmei (TW)

(73) Assignee: Taiwan Semiconductor Manufacturing Co., Ltd.

( * ) Notice: Subject to any disclaimer, the term of this patent is extended or adjusted under 35 U.S.C. 154(b) by 10 days.

(21) Appl. No.: 16/408,769

(22) Filed: May 10, 2019

(65) Prior Publication Data

US 2020/0103290 A1 Apr. 2, 2020

Related U.S. Application Data

(60) Provisional application No. 62/737,439, filed on Sep. 27, 2018.

(51) Int. Cl.
*B81C 99/00* (2010.01)
*G01K 7/32* (2006.01)
(Continued)

(52) U.S. Cl.
CPC .............. *G01K 7/32* (2013.01); *B81B 3/0008* (2013.01); *B81C 1/00944* (2013.01);
(Continued)

(58) Field of Classification Search
CPC ............................................ B81C 2201/0108
See application file for complete search history.

(56) References Cited

U.S. PATENT DOCUMENTS 5,955,817 A 9/1999 Dhuler et al.
7,444,873 B2 11/2008 Robert
(Continued)

FOREIGN PATENT DOCUMENTS

CN 106629575 A 5/2017
CN 106680332 A 5/2017
(Continued)

OTHER PUBLICATIONS

Office Action, dated Sep. 25, 2020, for Korean Intellectual Property Office Appl. No. 10-2019-0112009, 4 pages.
(Continued)

*Primary Examiner* — Peniel M Gumedzoe
*Assistant Examiner* — Christopher A Johnson
(74) *Attorney, Agent, or Firm* — Sterne, Kessler, Goldstein & Fox P.L.L.C.

(57) ABSTRACT

The structure of a micro-electro-mechanical system (MEMS) thermal sensor and a method of fabricating the MEMS thermal sensor are disclosed. A method of fabricating a MEMS thermal sensor includes forming first and second sensing electrodes with first and second electrode fingers, respectively, on a substrate and forming a patterned layer with a rectangular cross-section between a pair of the first electrode fingers. The first and second electrode fingers are formed in an interdigitated configuration and suspended above the substrate. The method further includes modifying the patterned layer to have a curved cross-section between the pair of the first electrode fingers, forming a curved sensing element on the modified patterned layer to couple to the pair of the first electrode fingers, and removing the modified patterned layer.

20 Claims, 27 Drawing Sheets

(51) Int. Cl.
*B81B 3/00* (2006.01)
*B81C 1/00* (2006.01)

(52) U.S. Cl.
CPC ............. *B81B 2201/0278* (2013.01); *B81B 2203/0136* (2013.01); *B81B 2203/04* (2013.01); *B81C 2201/013* (2013.01); *B81C 2201/0105* (2013.01); *B81C 2201/0116* (2013.01)

(56) References Cited

U.S. PATENT DOCUMENTS

| | | |
|---|---|---|
| 9,148,726 B2 | 9/2015 | Dehe |
| 10,241,094 B2 | 3/2019 | Ahn et al. |
| 2014/0061845 A1* | 3/2014 | Purkl ............... G01J 5/046 257/467 |
| 2019/0140061 A1 | 5/2019 | Chu-Kung et al. |
| 2019/0265266 A1* | 8/2019 | Nagata ............ G01C 19/5733 |

FOREIGN PATENT DOCUMENTS

| | | |
|---|---|---|
| EP | 1008161 B1 | 7/2002 |
| JP | 2006189431 A | 7/2006 |
| KR | 20130028880 A | 3/2013 |
| TW | 200508590 A | 3/2005 |
| TW | 201810662 A | 3/2018 |

OTHER PUBLICATIONS

Notice of Allowance, dated Dec. 25, 2020, for Taiwan Intellectual Property Office Appl. No. 108134713, 5 pages.

\* cited by examiner

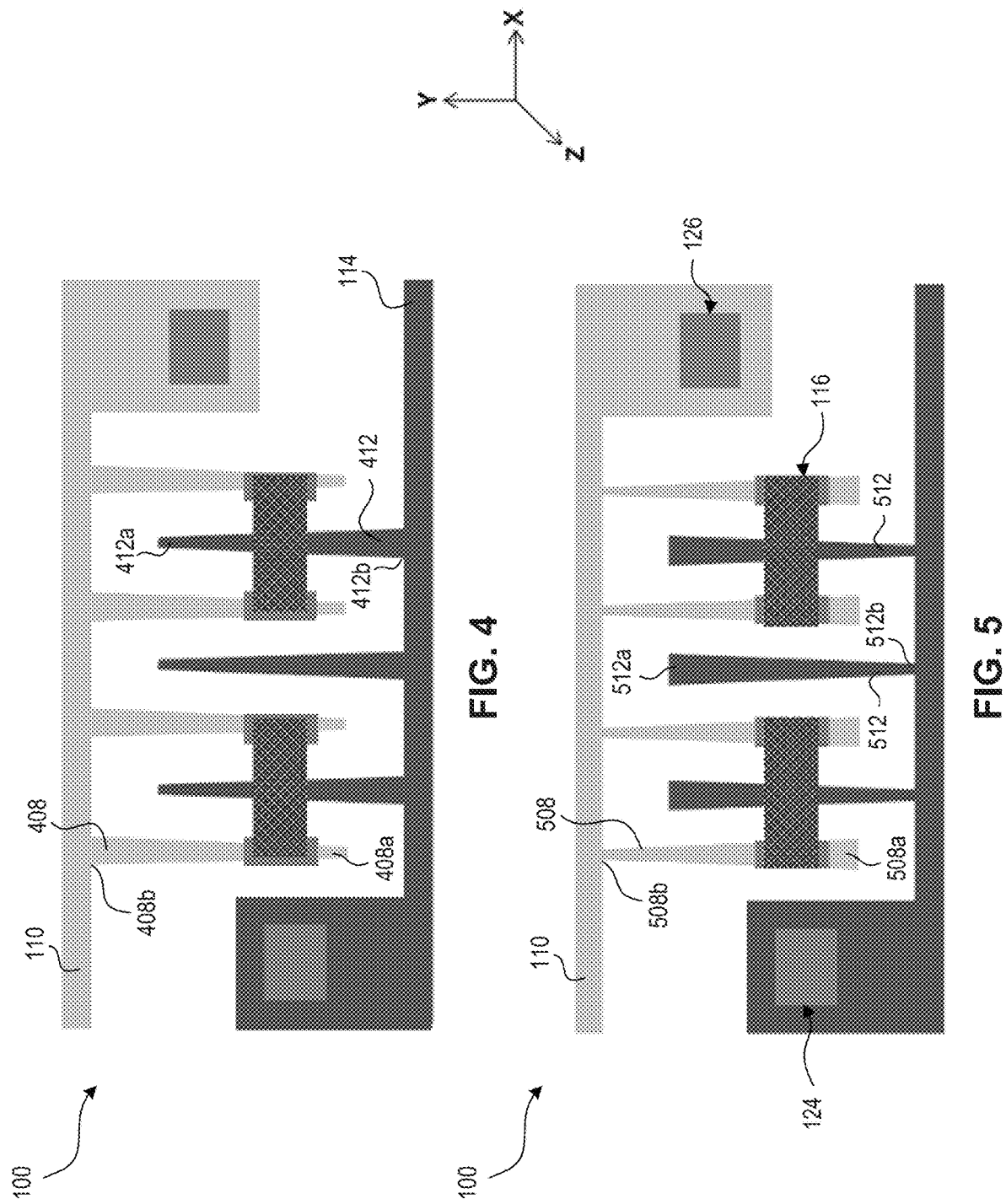

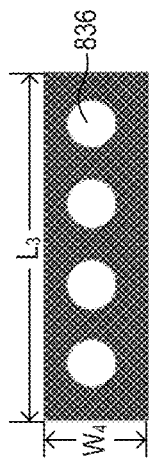
FIG. 6
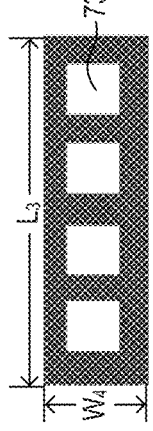
FIG. 7
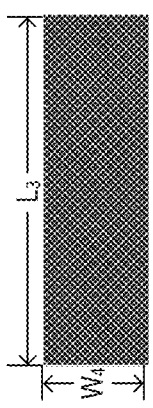
FIG. 8
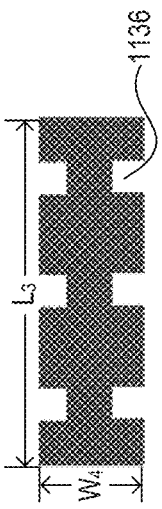
FIG. 9
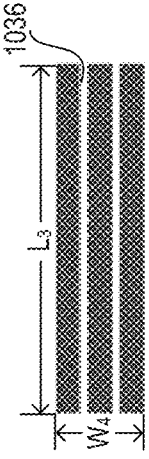
FIG. 10
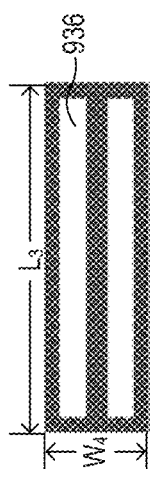
FIG. 11
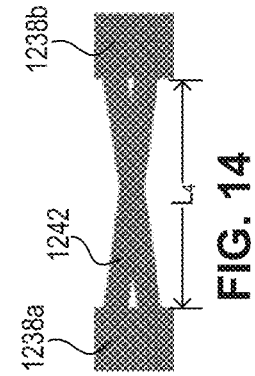
FIG. 12
FIG. 13
FIG. 14
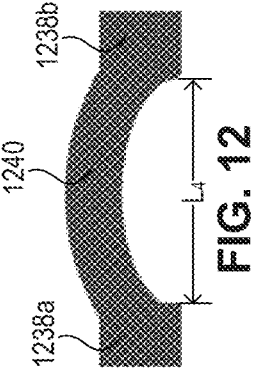
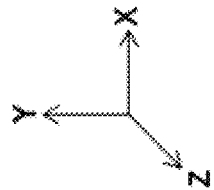

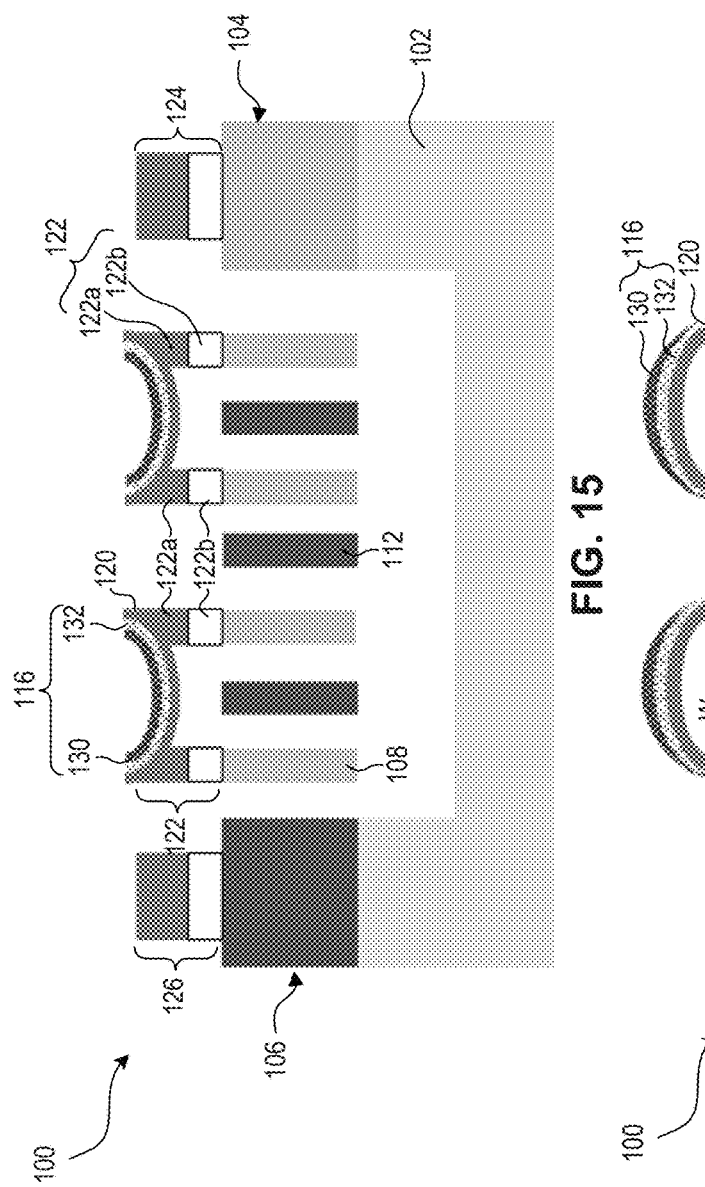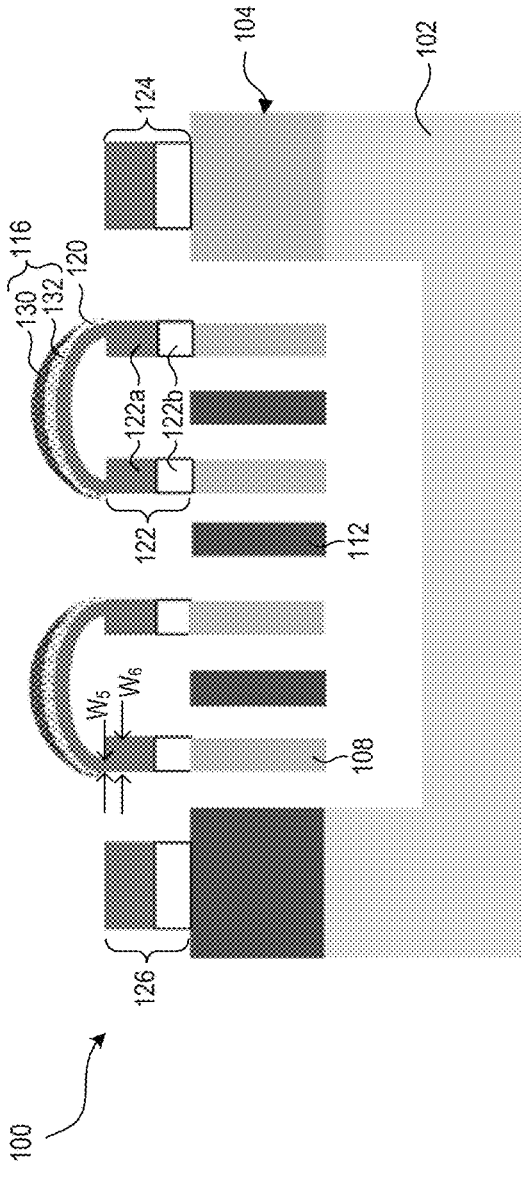

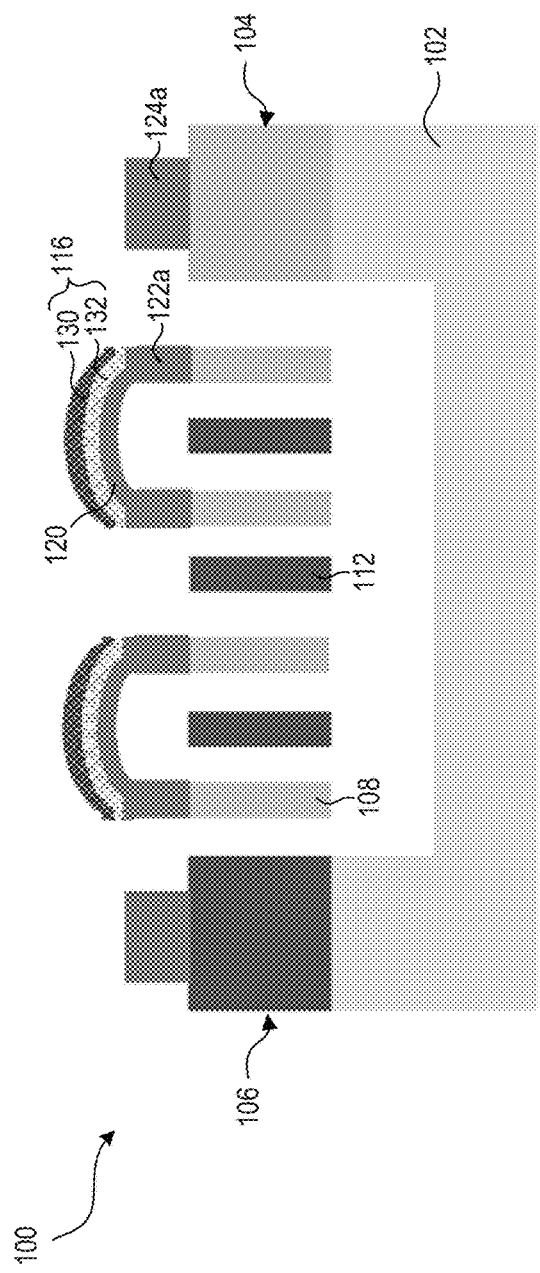
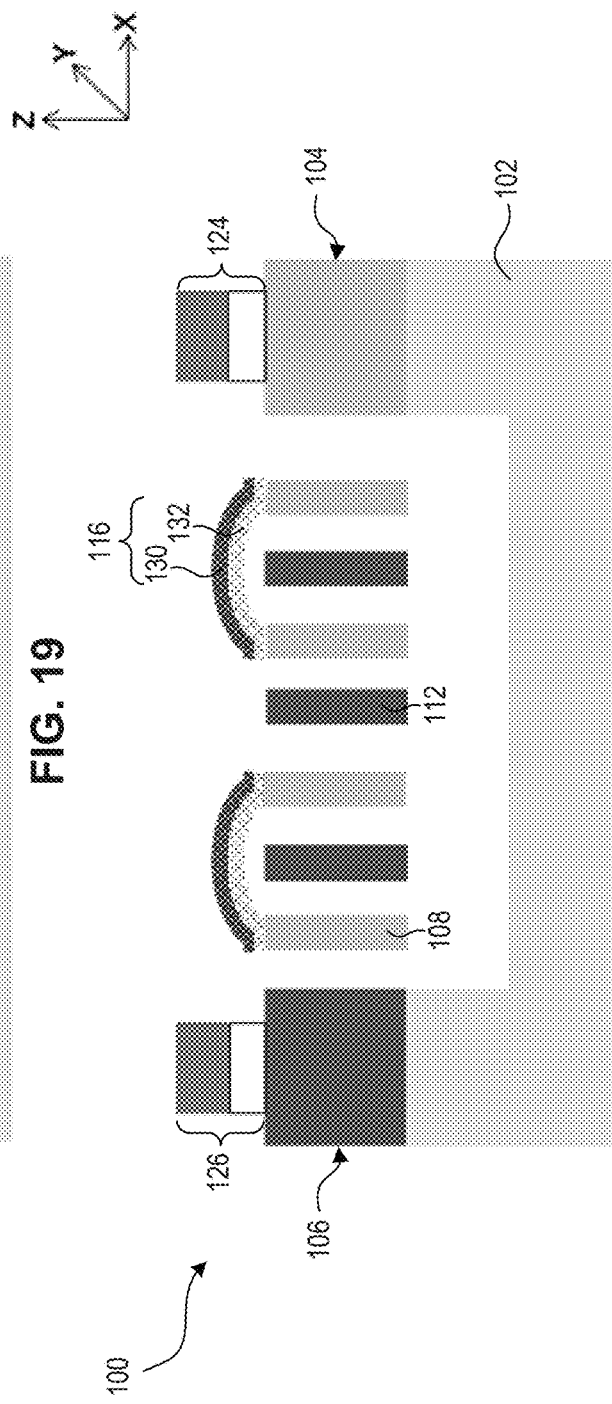

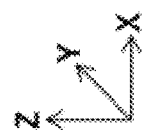
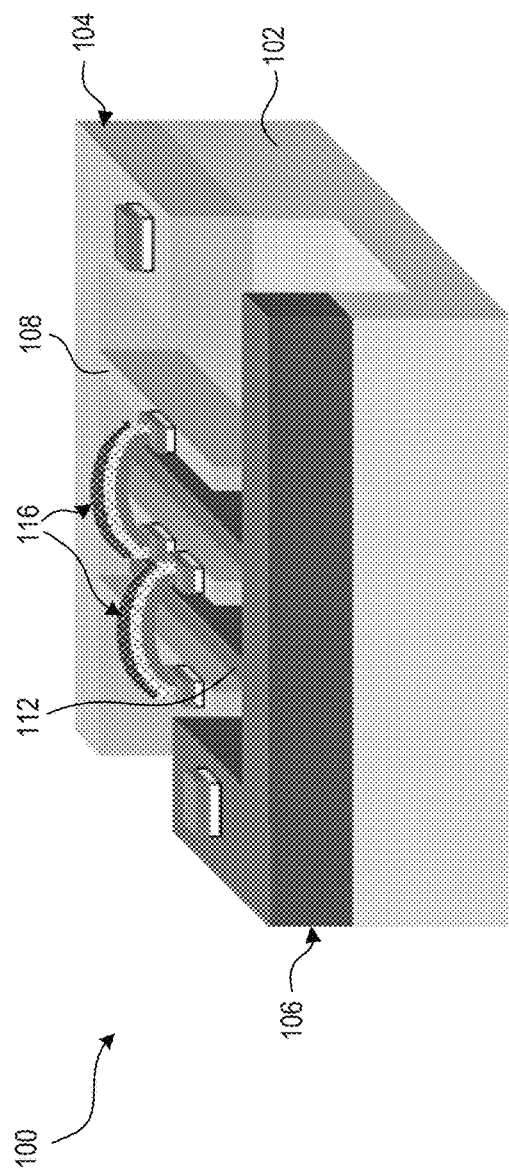
FIG. 23
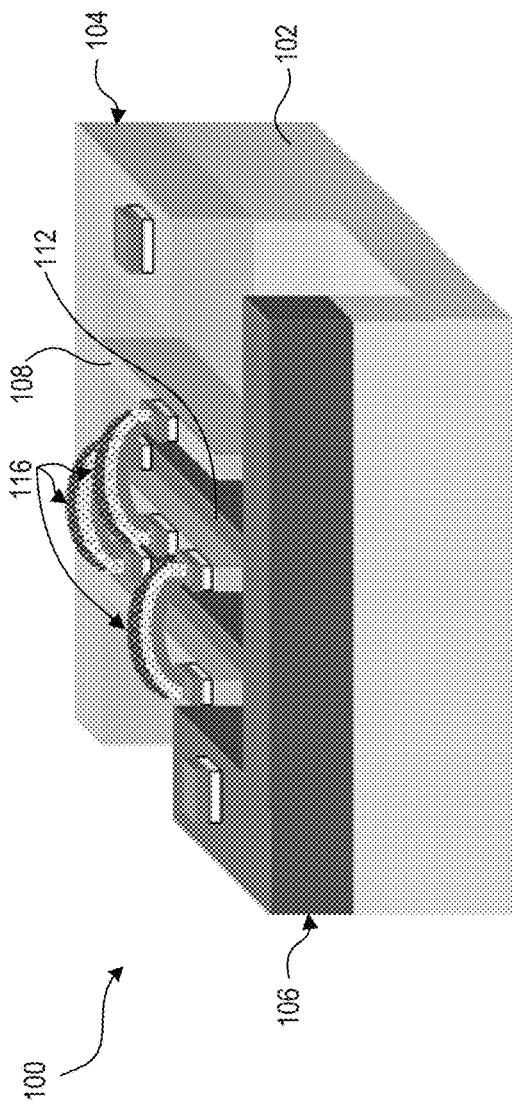
FIG. 24

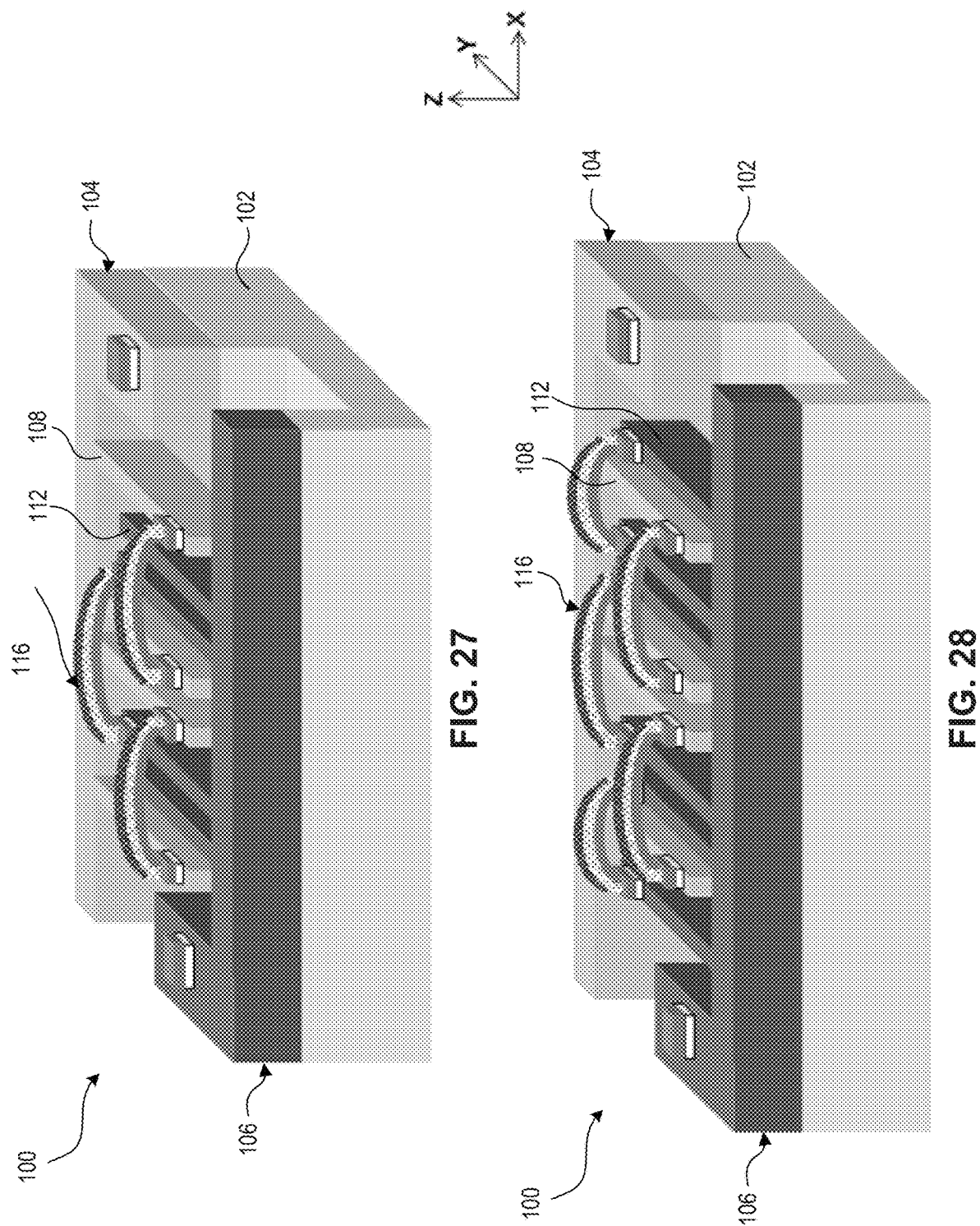

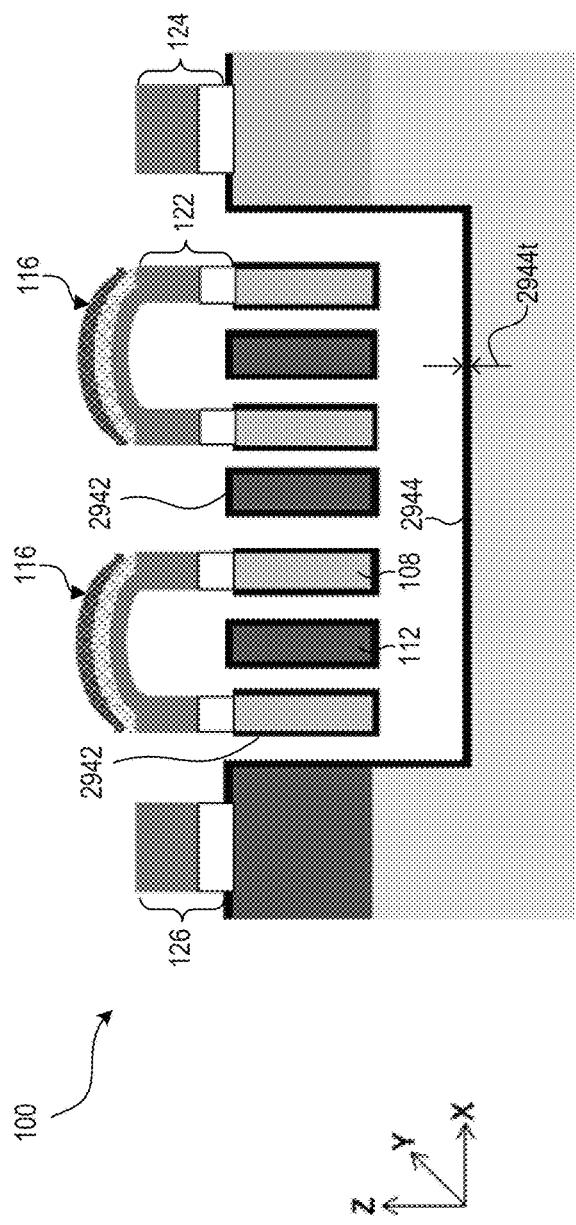
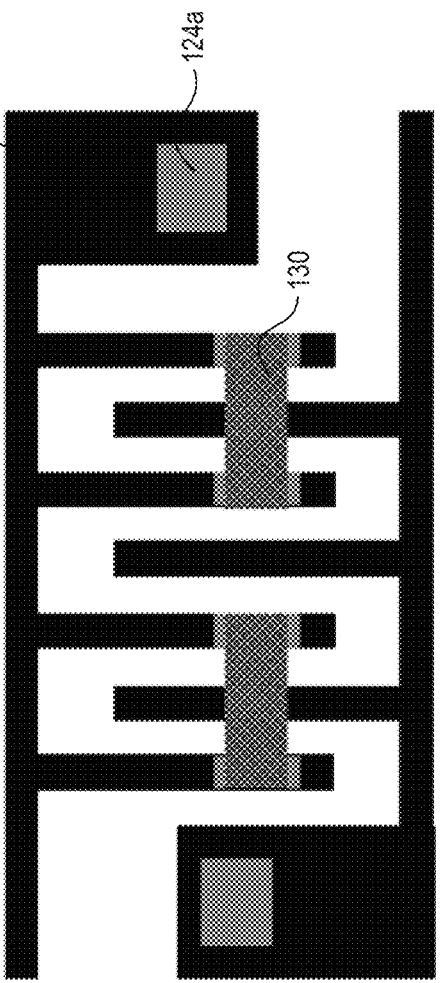
FIG. 29
FIG. 30

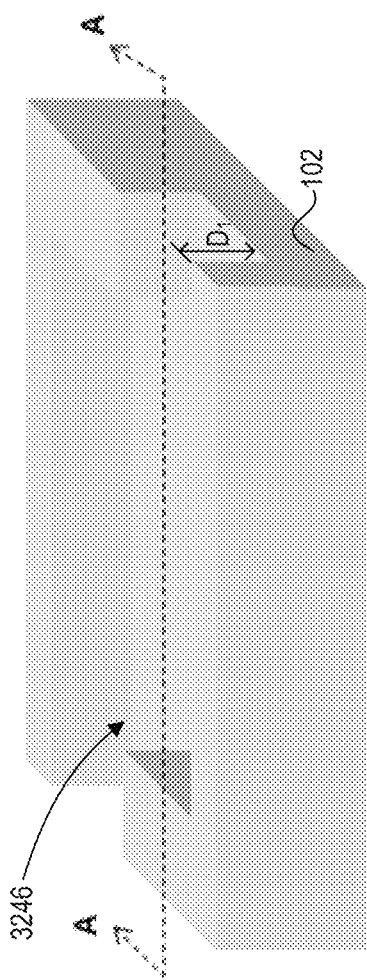
FIG. 32A
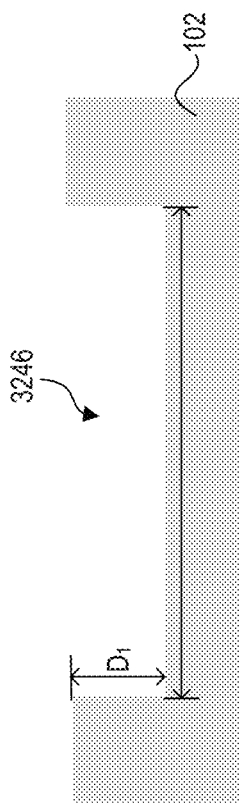
FIG. 32B
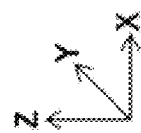

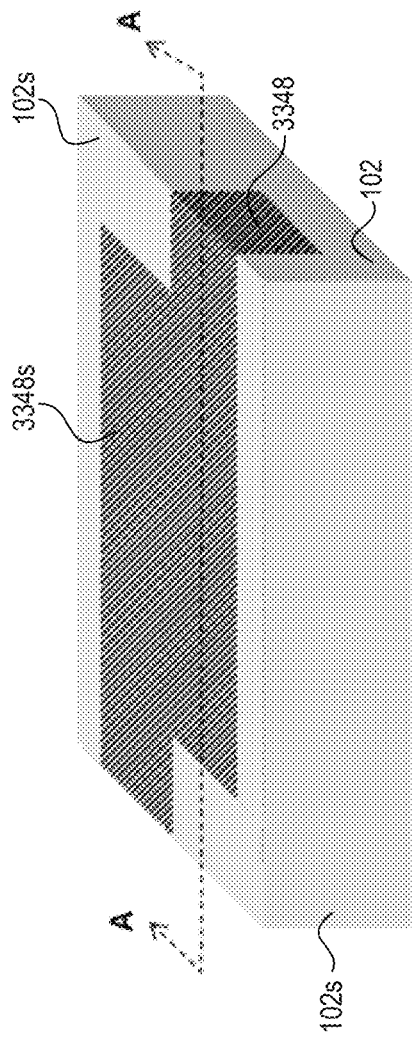
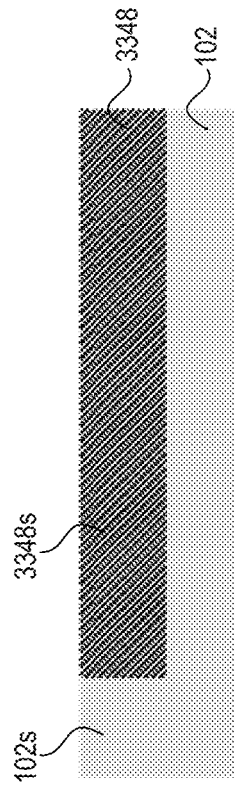
FIG. 33A
FIG. 33B

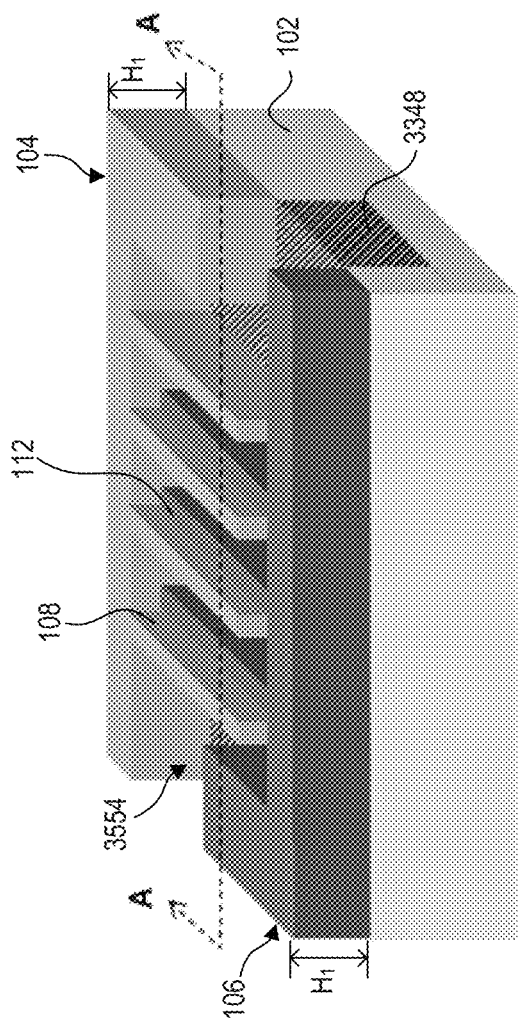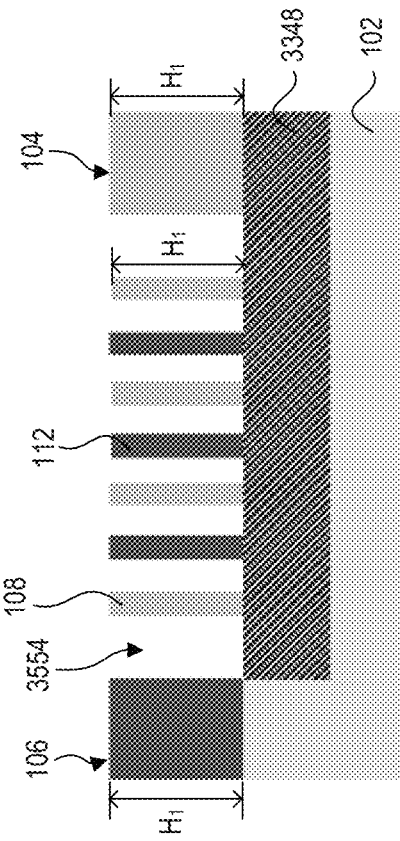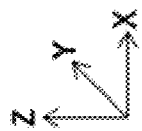

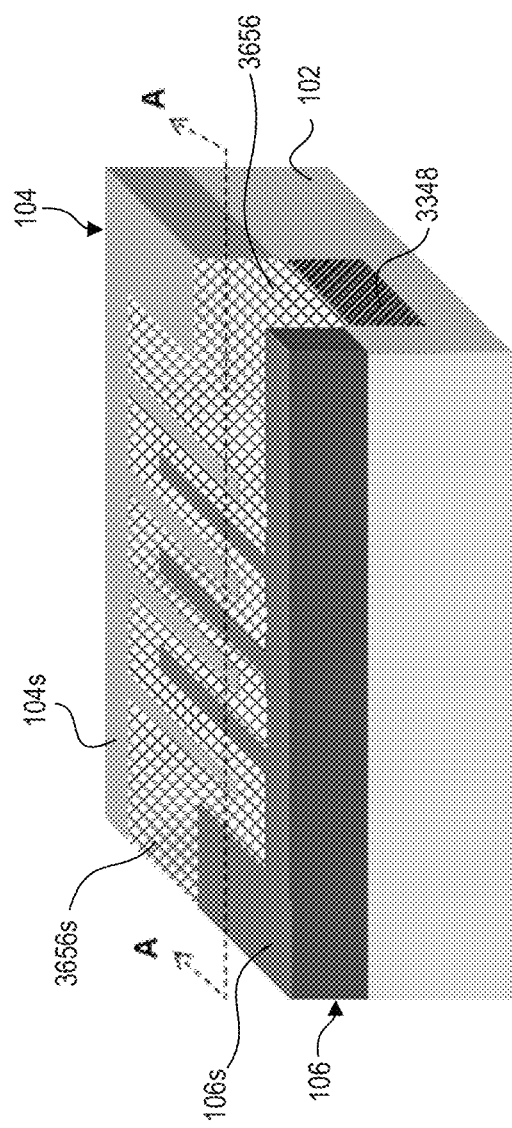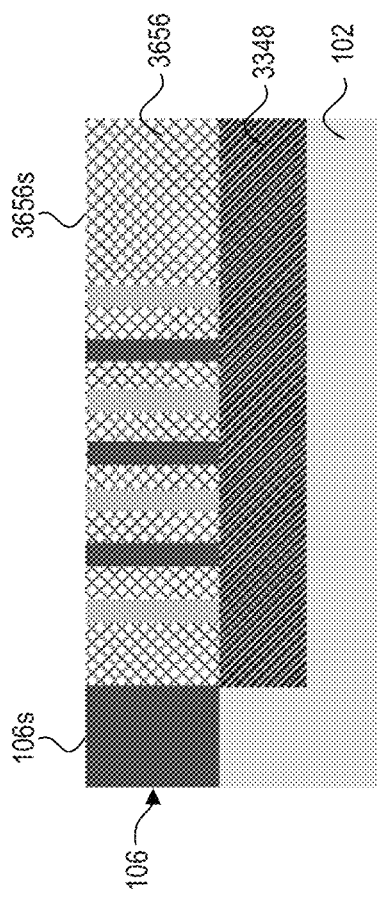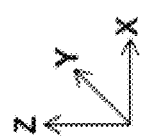
FIG. 36A
FIG. 36B

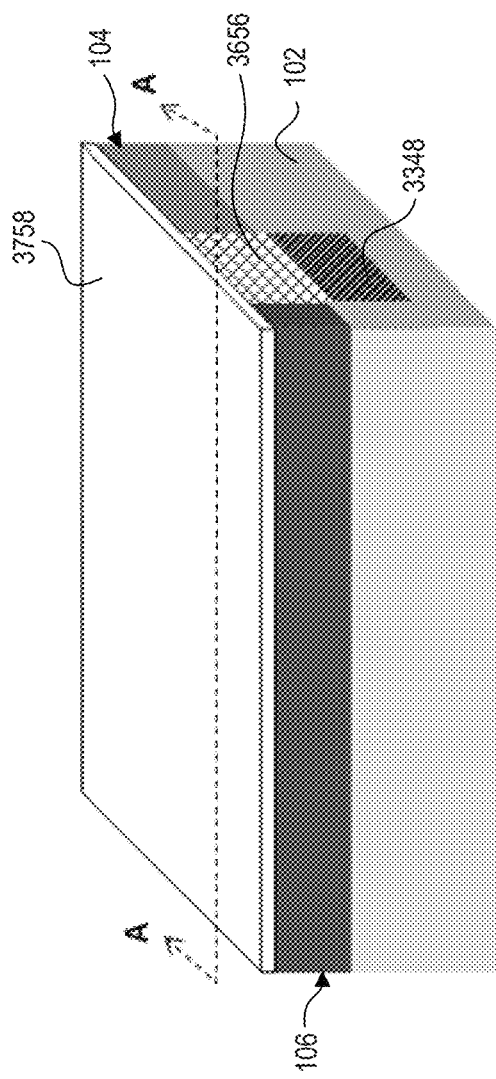
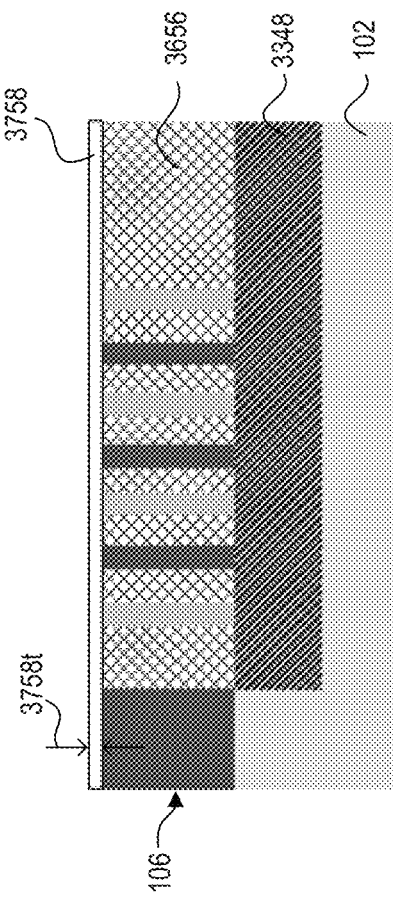
FIG. 37A
FIG. 37B

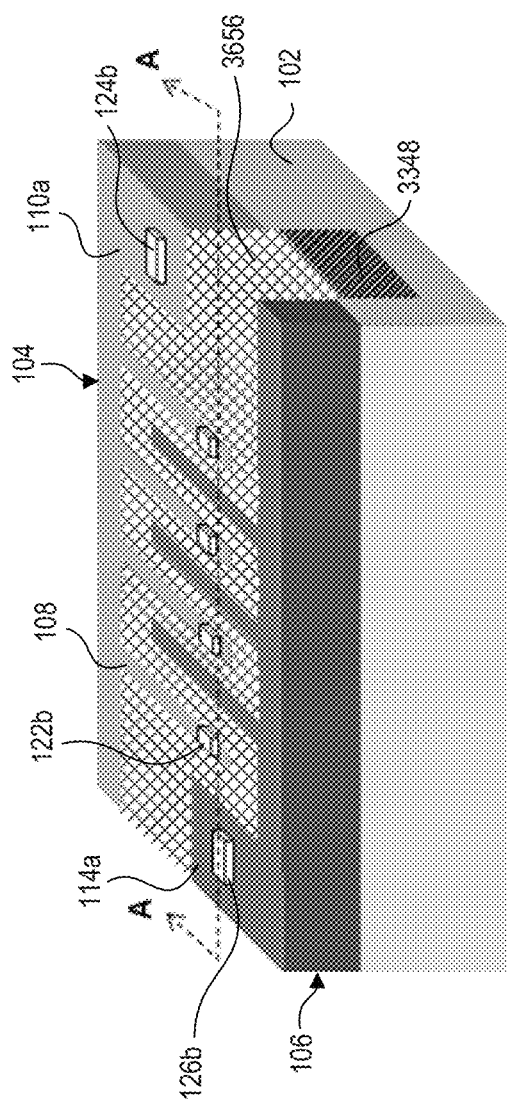
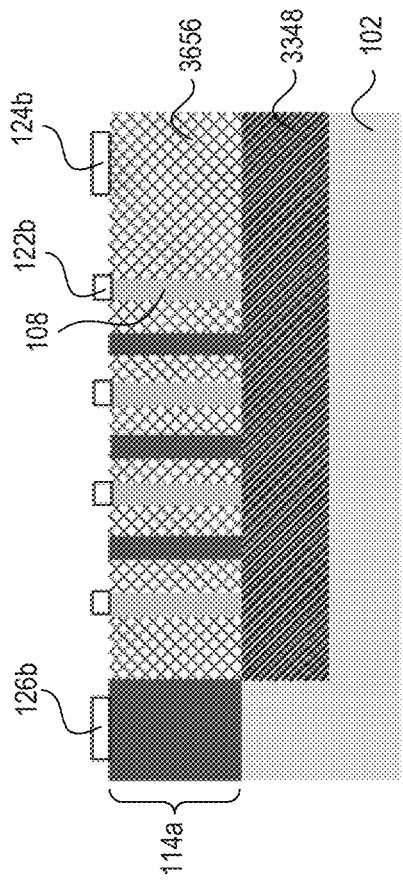
FIG. 38A
FIG. 38B

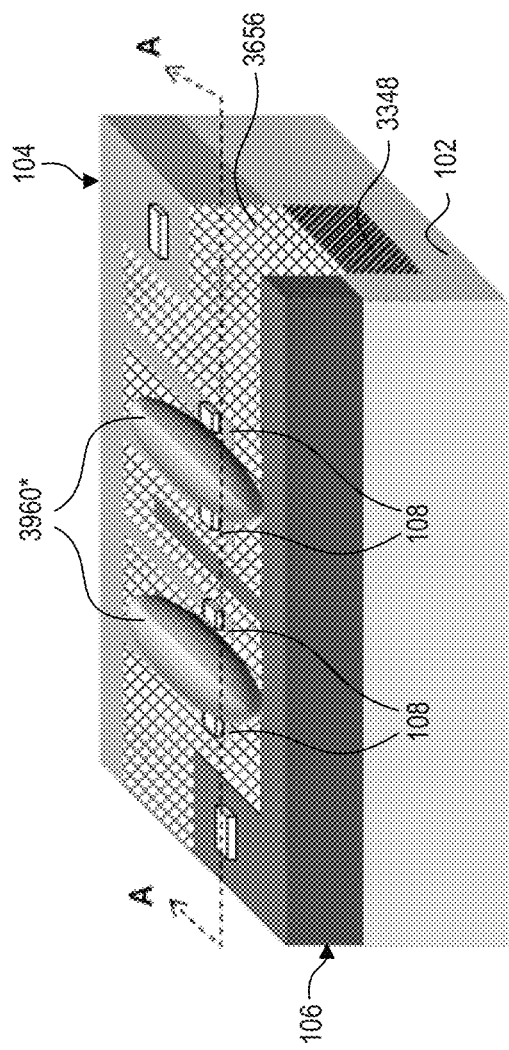
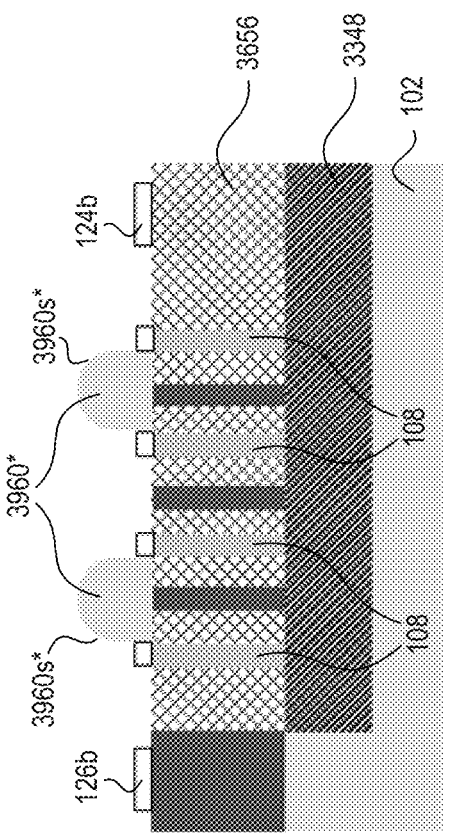
FIG. 40A
FIG. 40B

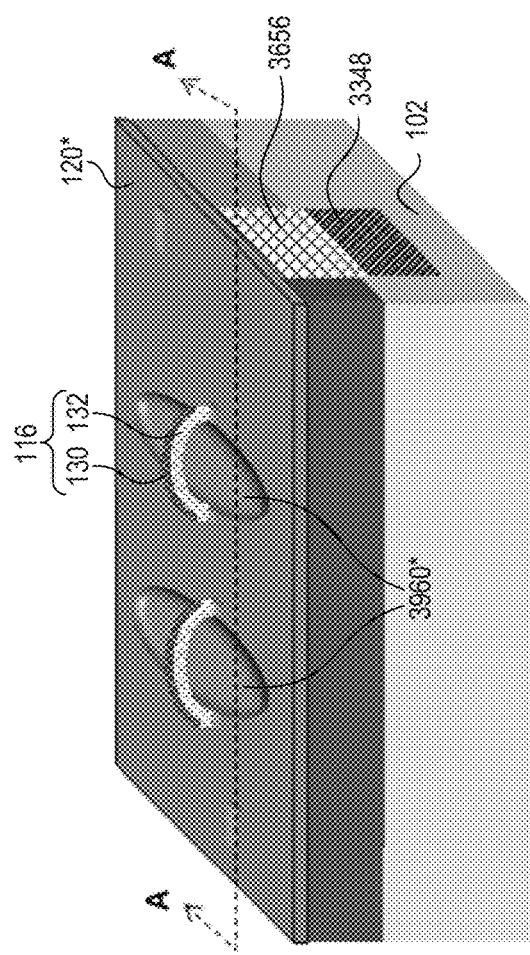
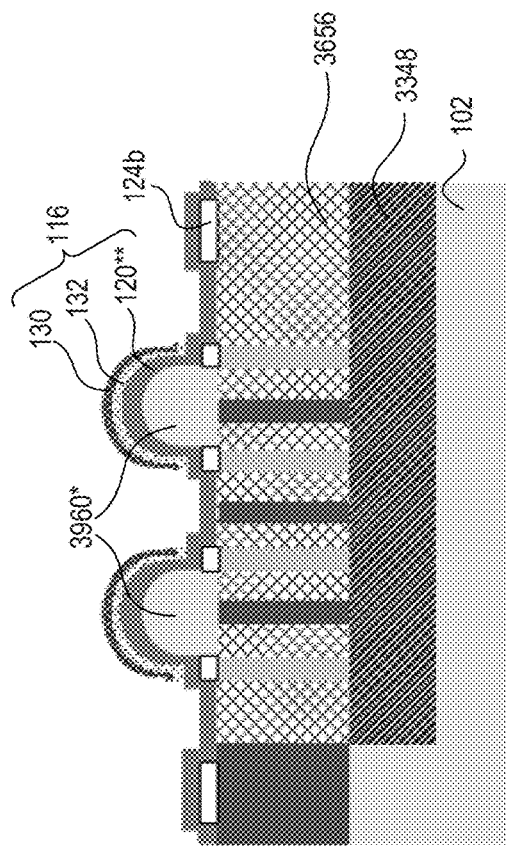
FIG. 42A
FIG. 42B

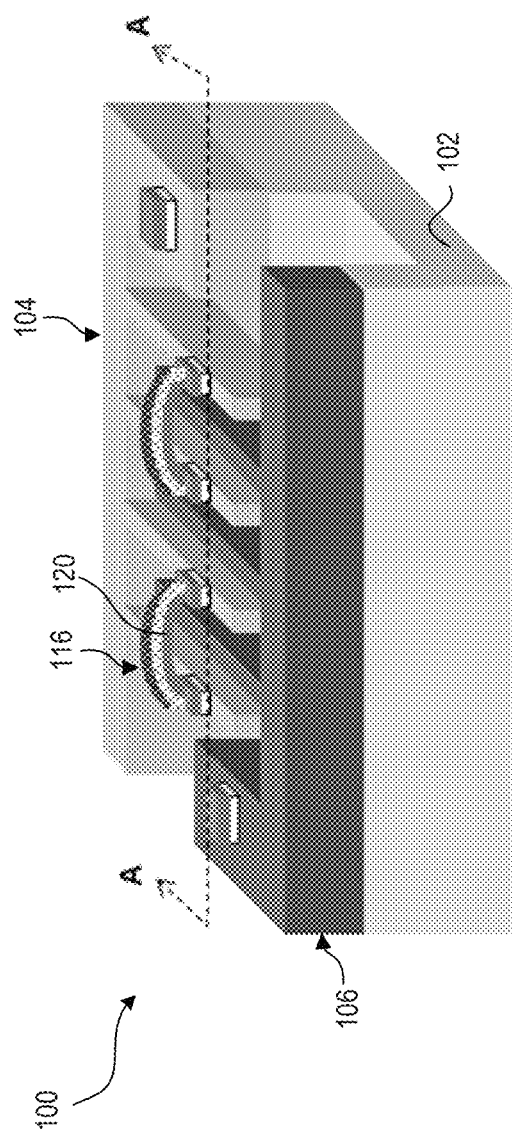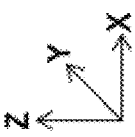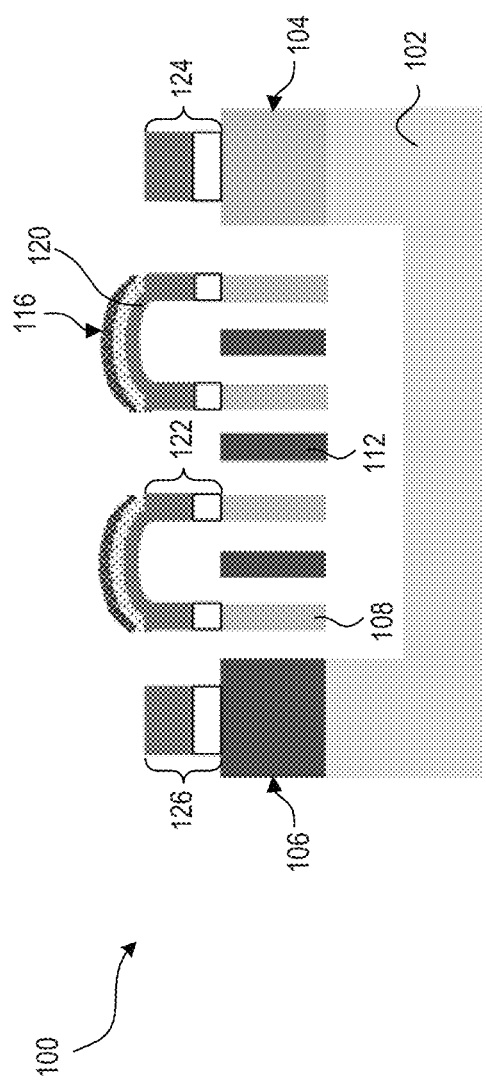
FIG. 44A
FIG. 44B

MICRO-ELECTRO-MECHANICAL SYSTEM (MEMS) THERMAL SENSOR

CROSS-REFERENCE TO RELATED APPLICATIONS

This application claims priority of U.S. Provisional Patent Application No. 62/737,439, titled "Temperature Sensor," filed Sep. 27, 2018, the disclosure of which is incorporated by reference in its entirety.

BACKGROUND

Micro-electro-mechanical systems (MEMS) are used in various sensor devices, such as accelerometers, pressure sensors, thermal sensors, and position sensors. The operation of MEMS sensor devices can be based on capacitive sensing technology that converts mechanical movements of sensing elements into electrical signals. The mechanical movements can be in response to inputs received by or applied to the sensing elements of the MEMS sensor devices. The electrical signals can be used to measure properties of the inputs sensed by the sensing elements.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4-5 illustrate top plan views of a MEMS thermal sensor with various structures of electrode fingers, in accordance with some embodiments.

FIGS. 6-14 illustrate various top plan views of a sensing element, in accordance with some embodiments.

FIGS. 15-20 illustrate cross-sectional views of a MEMS thermal sensor with various configurations of sensing elements, in accordance with some embodiments.

FIGS. 21-28 illustrate isometric views of a MEMS thermal sensor with various configurations of sensing elements and electrode fingers, in accordance with some embodiments.

FIG. 29 illustrates a cross-sectional view of a MEMS thermal sensor, in accordance with some embodiments.

FIG. 30 illustrates a top plan views of a MEMS thermal sensor, in accordance with some embodiments.

FIGS. 32A-44A illustrate isometric views of a MEMS thermal sensor at various stages of its fabrication process, in accordance with some embodiments.

FIGS. 32B-44B illustrate cross-sectional views of a MEMS thermal sensor at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
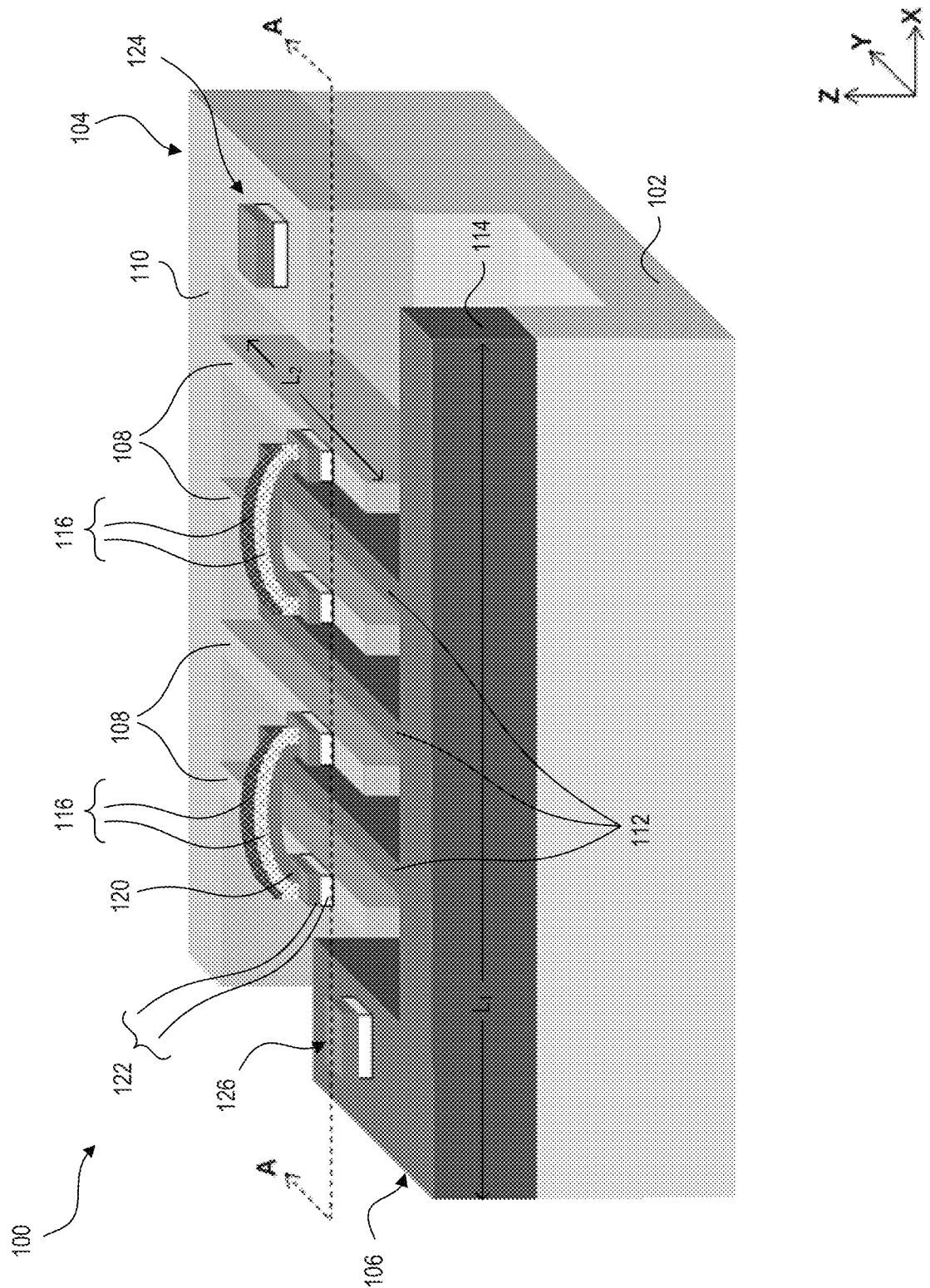
FIG. 1A-1C illustrate an isometric view, a cross-sectional view, and a top plan view of a MEMS thermal sensor, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

As used herein, the term "substantially" indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The present disclosure provides example structures of a MEMS thermal sensor and example methods for fabricating the same. The MEMS thermal sensor can be configured to measure temperatures based on capacitive sensing technology. In some embodiments, the MEMS thermal sensor can have a pair of capacitive sensing electrodes with interdigitated electrode fingers coupled to curved sense elements. The sense elements can be configured to sense temperature and generate mechanical movements in the electrode fingers that can result in a change in capacitance between the sense electrodes. Based on the capacitance between the sense electrodes, the MEMS thermal sensor can measure temperatures sensed by the sense elements.

Compared to sensors with non-curved (e.g., flat) sense elements, the curved configuration of the sense elements disclosed herein enables bidirectional mechanical movements of the electrode fingers and, as a result, generates a wider range of mechanical movements in lateral directions in response to temperatures sensed by the curved sense elements. In some embodiments, the range of mechanical movements of each electrode finger coupled to a curved sense element is increased by about 10% to about 50% (e.g., about 15%, about 20%, about 25%, about 30%, about 35%, about 40%, or about 45%) compared to sensors with non-curved sense elements. In some embodiments, the range of mechanical movements of each electrode finger coupled to a curved sense element can be from about 1 nm to about 100 μm (e.g., about 5 nm, about 10 nm, about 20 nm, about 50 nm, about 100 nm, about 200 nm, about 500 nm, about 700 nm, about 900 nm, about 1 μm, about 5 μm, about 7 μm, about 10 μm, about 20 μm, about 50 μm, about 70 μm, or about 90 μm).

The wider range of mechanical movements can generate a wider range of variation in the capacitance between the sense electrodes. As a result, the MEMS thermal sensor can sense and measure a wider range of temperatures based on the capacitance between the sense electrodes and be more sensitive to temperature variations compared to sensors with non-curved sense elements. In some embodiments, the sensitivity of the MEMS thermal sensor is increased by about 10% to about 60% (e.g., about 15%, about 20%, about 25%, about 30%, about 35%, about 40%, about 45%, about 50%, or about 55%) compared to sensors with non-curved sense elements.

Figure 1B:
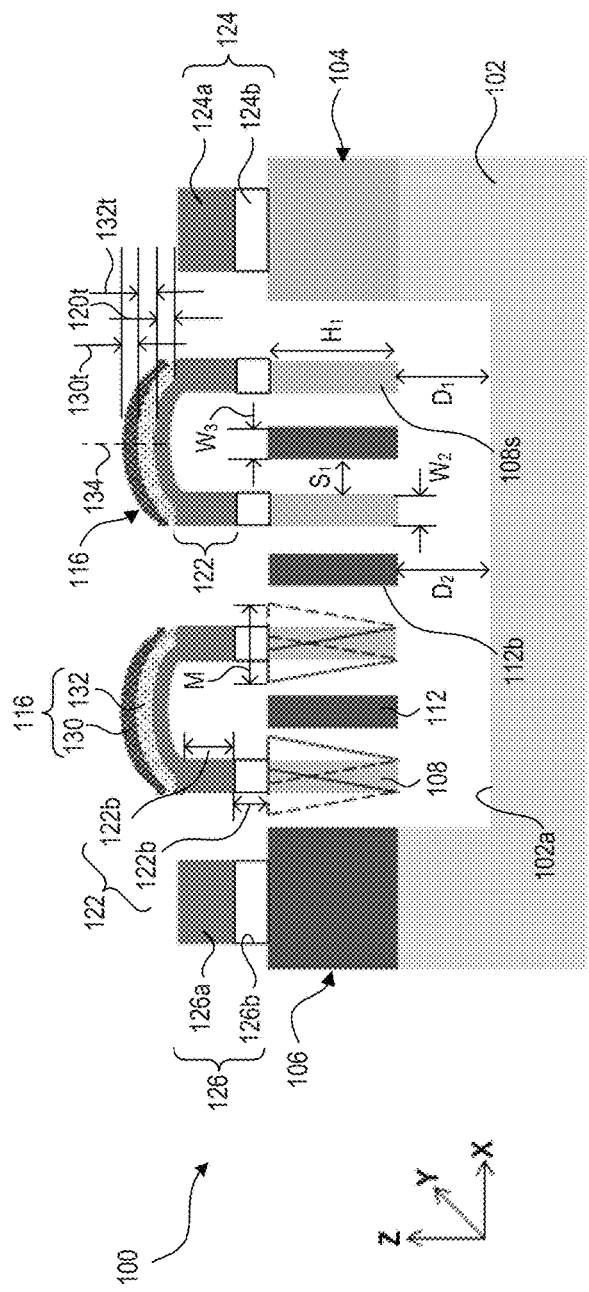
Figure 1C:
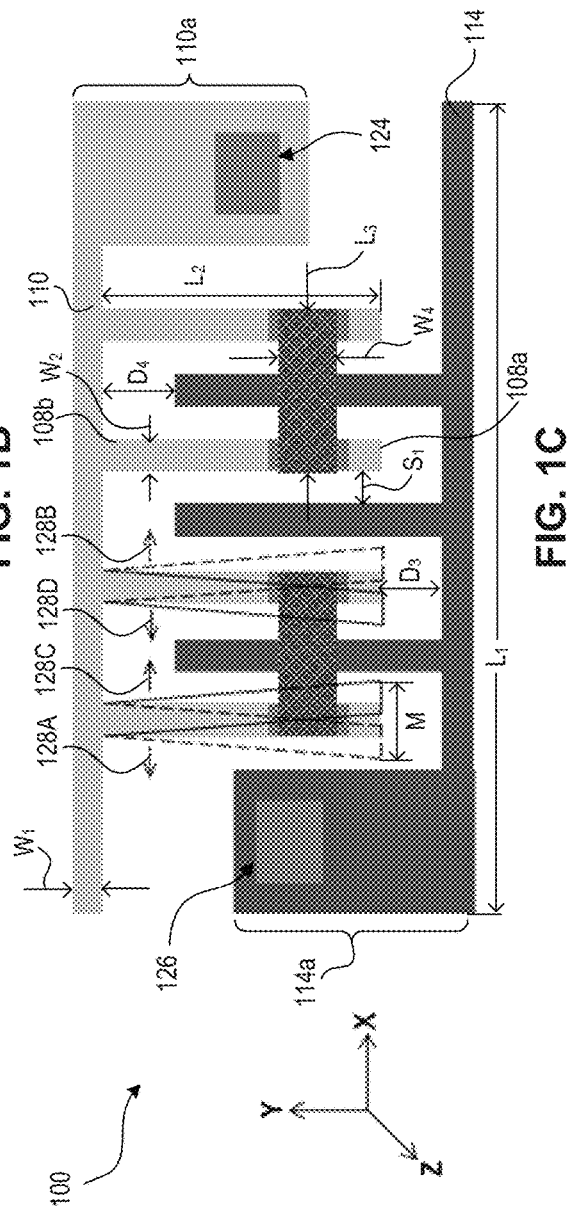

FIG. 1A illustrates an isometric view of a MEMS thermal sensor 100, according to some embodiments. FIG. 1B illustrates a cross-sectional view along line A-A of MEMS thermal sensor 100 of FIG. 1A. FIG. 1C illustrates a top plan view of MEMS thermal sensor 100, according to some embodiments. MEMS thermal sensor 100 can include comb-shaped capacitive sensing electrodes 104 and 106 positioned facing each other on a substrate 102. Sensing electrode 104 can have a plurality of electrode fingers 108 extending from an electrode bar 110 and suspended above substrate 102. The plurality of electrode fingers 108 extends in a direction (e.g., Y-axis) substantially perpendicular to the direction (e.g., X-axis) along which electrode bar 110 extends. Similar to sensing electrode 104, sensing electrode 106 can have a plurality of electrode fingers 112 extending from an electrode bar 114 and suspended above substrate 102. The plurality of electrode fingers 112 extends in a direction (e.g., Y-axis) substantially perpendicular to the direction (e.g., X-axis) along which electrode bar 114 extends. The plurality of electrode fingers 108 can be positioned in an interdigitated configuration with the plurality of electrode fingers 112.

Substrate 102 and/or sensing electrodes 104 and 106 can be a semiconductor material such as, but not limited to, silicon. In some embodiments, substrate 102 and/or sensing electrodes 104 and 106 can include an elementary semiconductor, such as silicon or germanium; a compound semiconductor including silicon carbide, gallium arsenide, gallium phosphide, indium phosphide, indium arsenide, and/or indium antimonide; an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or a combination thereof.

In some embodiments, sensing electrodes 104 and 106 can include a metallic material (e.g., aluminum (Al), copper (Cu), aluminum copper (AlCu), iron (Fe), nickel (Ni), stannum (Sn), copper nickel (CuNi), chromium (Cr), platinum (Pt), tungsten (W), titanium (Ti), tantalum (Ta), rhodium (Rh), platinum rhodium (PtRh), tantalum nitride (TaN), nickel silicide (NiSi), cobalt (Co), cobalt silicide (CoSi), silver (Ag), tantalum carbide (TaC), titanium aluminum (TiAl), metal alloys, and/or combinations thereof), a metal alloy, or doped or undoped polysilicon. In some embodiments, sensing electrodes 104 and 106 can include a conductive material with an electrical resistivity ranging from about $1\times10^{-15}$ Ωm to about $1\times10^{15}$ Ωm (e.g., about $1\times10^{-12}$ Ωm, about $1\times10^{-10}$ Ωm, about $1\times10^{-9}$ Ωm, about $1\times10^{-8}$ Ωm, about $1\times10^{-7}$ Ωm, about $1\times10^{-6}$ Ωm, about $1\times10^{-5}$ Ωm, about $1\times10^{-4}$ Ωm, about $1\times10^{-2}$ Ωm, about $1\times10$ Ωm, about $1\times10^{5}$ Ωm, or $1\times10^{10}$ Ωm) at a room temperature (e.g., about 20° C., about 23° C., or about 25° C.).

Referring to FIGS. 1A and 1C, each of electrode bars 110 and 114 can have a horizontal dimension $L_1$ along an X-axis (e.g., length) ranging from about 1 μm to about 5 mm (e.g., about 10 μm, about 50 μm, about 100 μm, 250 μm, about 500 μm, about 750 μm, about 1 mm, about 2 mm, or about 4 mm). The portion of each electrode bars 110 and 114 from which respective electrode fingers 108 and 112 extend can have a horizontal dimension $W_1$ (shown in FIG. 1C) along a Y-axis (e.g., width) ranging from about 100 nm to about 100 μm (e.g., about 200 nm, about 500 nm, about 700 nm, about 1 μm, about 10 μm, about 20 μm, about 50 μm, about 70 μm or about 90 μm). In some embodiments, capacitance between sensing electrodes 104 and 106 can be measured by using measurement probes directly on electrode bars 110 and 114.

In some embodiments, electrode bars 110 and 114 can have contact regions 110a and 114a with measurement contact pads 124 and 126, respectively, configured to measure capacitance between sensing electrodes 110 and 114. Measurement contact pads 124 and 126 can have first conductive layers 124a and 126a on (e.g., directly on) contact regions 110a and 114a, respectively; or as shown in FIGS. 1A-1B, they can have additional first buffer layers 124b and 126b interposed between first conductive layers 124a and 126a and contact regions 110a and 114a, respectively. First buffer layers 124b and 126b can include oxide or nitride materials.

Figure 2:
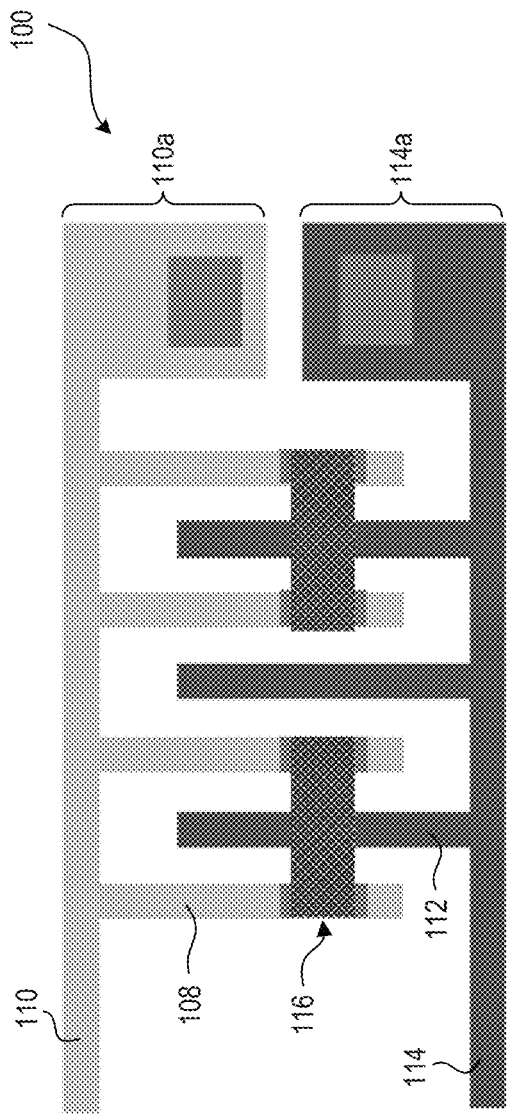
FIGS. 2-3 illustrate top plan views of a MEMS thermal sensor with various configurations of measurement contact pads, in accordance with some embodiments.
Figure 3:
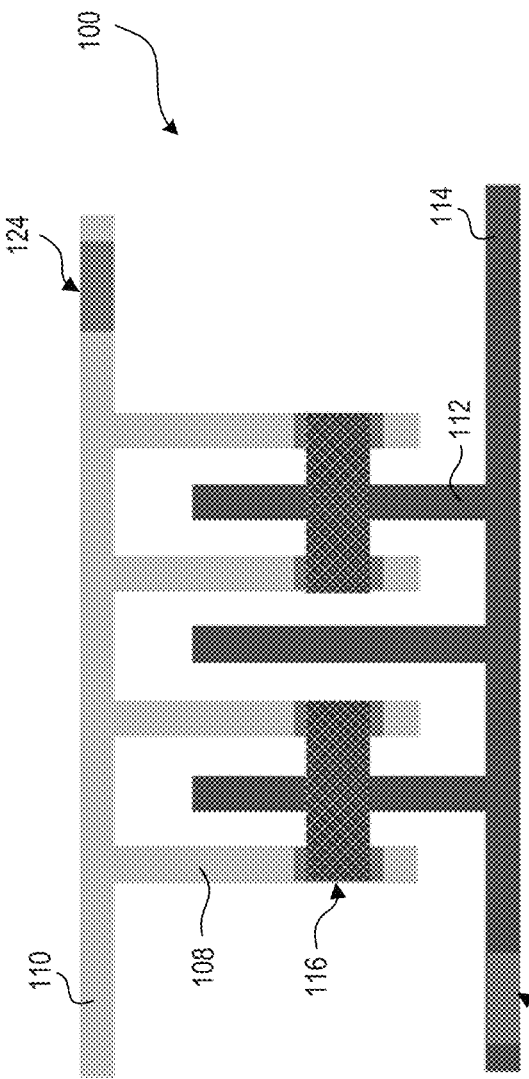
Figure 17:
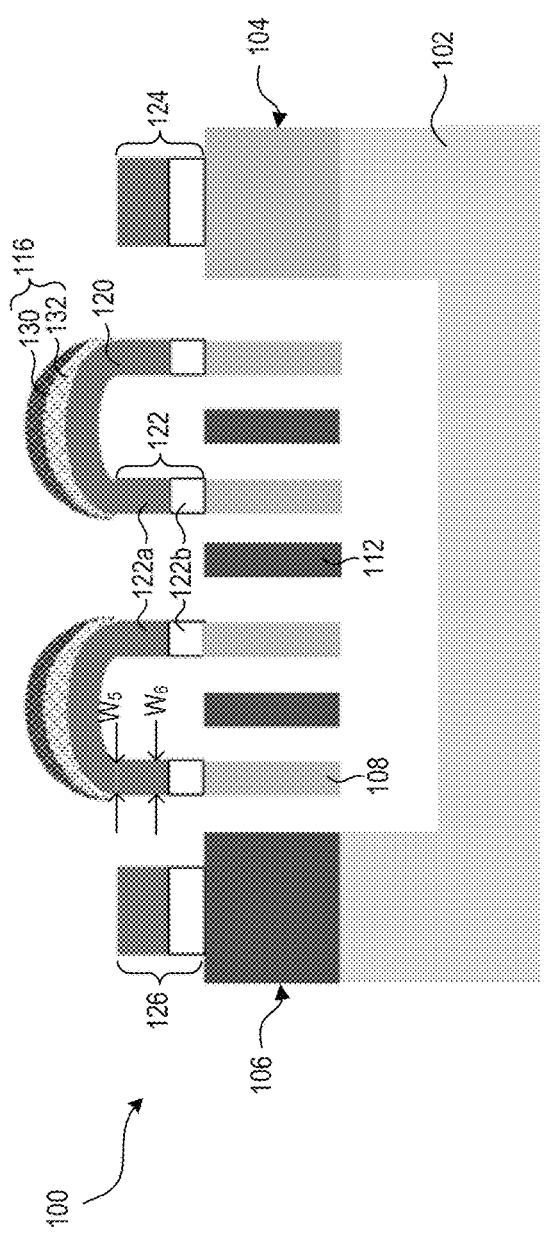
Figure 18:
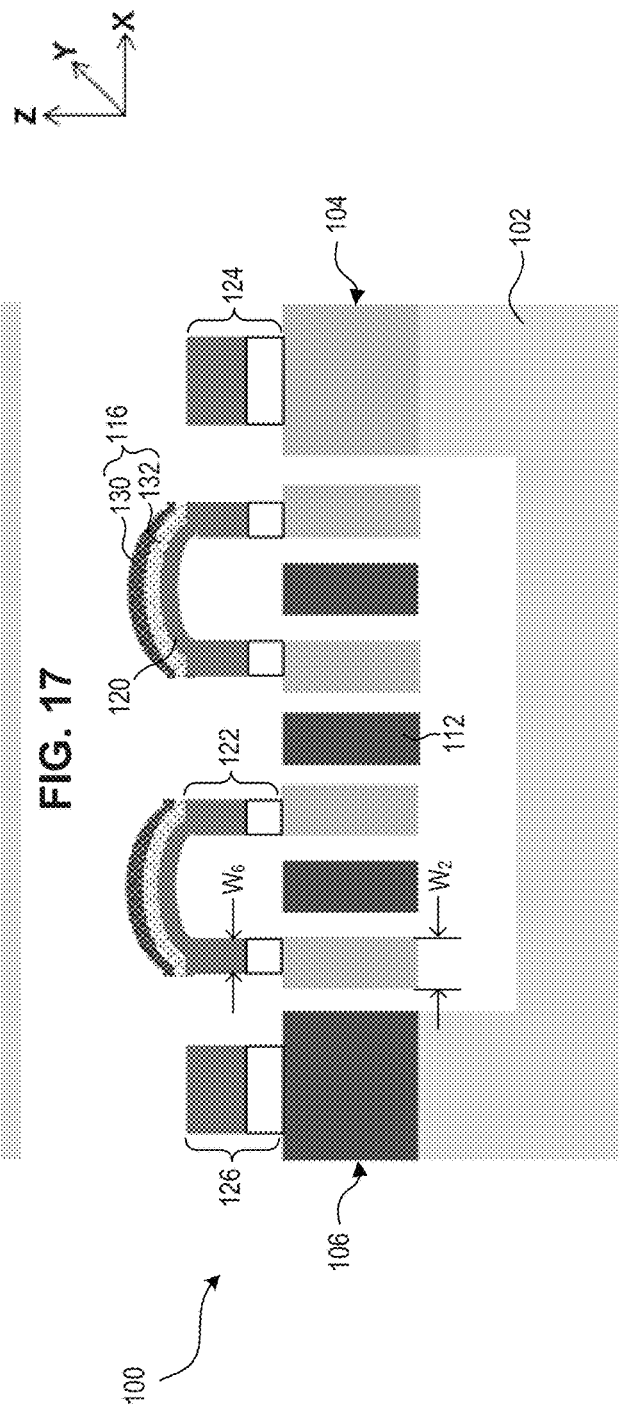

In some embodiments, instead of contact regions 110a and 114a being positioned on opposite ends of an array of electrode fingers 108 (shown in FIGS. 1A and 1C), contact regions 110a and 114a can be positioned facing each other as shown in FIG. 2, which illustrates a top plan view of MEMS thermal sensor 100 with an alternate configuration contact regions 110a an 114a. In some embodiments, measurement contact pads 124 and 126 can be disposed on electrode bars 110 and 114, respectively, without contact regions 110a and 114a as shown in FIG. 3, which illustrates a top plan view of MEMS thermal sensor 100 with an alternate configuration of measurement contact pads 124 and 126.

Referring to FIGS. 1B-1C, each of electrode fingers 108 and 112 can have horizontal dimensions $W_2$ and $W_3$, respectively, along an X-axis (e.g., widths) ranging from about 100 nm to about 100 µm (e.g., about 200 nm, about 500 nm, about 700 nm, about 1 µm, about 5 µm, about 10 µm, about 20 µm, about 50 µm, about 70 µm or about 90 µm). In some embodiments, dimensions $W_2$ and $W_3$ can be equal to or different from each other. In some embodiments, each of electrode fingers 108 and 112 can have a horizontal dimension $L_2$ along a Y-axis (e.g., length) ranging from about 100 nm to about 100 µm (e.g., about 200 nm, about 500 nm, about 700 nm, about 1 µm, about 5 µm, about 10 µm, about 20 µm, about 50 µm, about 70 µm or about 90 µm). In some embodiments, electrode fingers 108 can have different lengths than electrode fingers 112. Each of electrode fingers 108 and 112 can have a vertical dimension $H_1$ along a Z-axis (e.g., height) ranging from about 100 nm to about 300 µm (e.g., about 200 nm, about 500 nm, about 700 nm, about 1 µm, about 5 µm, about 10 µm, about 20 µm, about 50 µm, about 70 µm, about 90 µm, about 100 µm, about 200 µm, or about 250 µm).

In some embodiments, adjacent electrode fingers 108 and 112 can be spaced apart from each other along a X-axis by a horizontal distance $S_1$ ranging from about 100 nm to about 100 µm (e.g., about 200 nm, about 500 nm, about 700 nm, about 1 µm, about 5 µm, about 10 µm, about 20 µm, about 50 µm, about 70 µm or about 90 µm). The spaces between electrode fingers 108 and 112 can include a dielectric gas, such as air or nitrogen, or a dielectric liquid, such as mineral oil, polymerized butenes, castor oil, or silicone oil.

Referring to FIG. 1B, electrode fingers 108 and 112 can be suspended above substrate 102 with vertical dimension $D_1$ between bottom surfaces 108s of electrode fingers 108 and a top surface 102a of substrate 102 and vertical distances $D_2$ between bottom surfaces 112b of electrode fingers 112 and top surface 102a. In some embodiments, distances $D_1$ and $D_2$ can be equal to or different from each other. Distances $D_1$ and $D_2$ can be along a Z-axis and can range from about 500 nm to about 500 µm (e.g., about 600 nm, about 700 nm, about 1 µm, about 5 µm, about 10 µm, about 20 µm, about 50 µm, about 70 µm, about 90 µm, about 100 µm, about 200 µm, about 250 µm, about 300 µm, or about 400 µm). Distances $D_1$ and $D_2$ less than 500 nm can introduce the effect of parasitic capacitance from between substrate 102 and electrode fingers 108 and 112 into capacitance measurements from between sensing electrodes 104 and 106. The parasitic capacitance effect in the capacitance measurements can result in measurement errors in MEMS thermal sensor 100. Distances $D_1$ and $D_2$ equal to or greater than 500 nm can help to reduce or prevent electrostatic attraction between substrate 102 and electrode fingers 108 and 112 that can cause stiction between them.

The word stiction, which is derived from the words static and friction, can refer to the undesirable consequence of a movable element (e.g., electrode fingers 108 and 112) in a MEMS device (e.g., MEMS thermal sensor 100) contacting and becoming stuck to a surrounding feature. The phenomenon of stiction can occur during operation of the MEMS device and/or during manufacture of the device. Various environmental factors and processes that take place during the manufacture of the MEMS device can give rise to stiction. For example, a plasma process during manufacture of the MEMS device can cause charge to build up on conductive surfaces (e.g., electrode fingers 108 and 112 or substrate 102) and cause an electrostatic attraction between the movable elements and surrounding features.

Referring to FIG. 1C, electrode fingers 108 and 112 can be spaced apart from electrode bars 114 and 110, respectively, by horizontal distances $D_3$ and $D_4$ along a Y-axis. In some embodiments, distances $D_3$ and $D_4$ can be equal to or different from each other. Distances $D_3$ and $D_4$ can range from about 500 nm to about 500 µm (e.g., about 600 nm, about 700 nm, about 1 µm, about 5 µm, about 10 µm, about 20 µm, about 50 µm, about 70 µm, about 90 µm, about 100 µm, about 200 µm, about 250 µm, about 300 µm, or about 400 µm). Distances $D_3$ and $D_4$ equal to or greater than 500 nm can help to reduce or prevent electrostatic attraction, and as a result, reduce or prevent stiction between electrode fingers 108 and 112 and electrode bars 114 and 110, respectively. Similar to distances $D_1$ and $D_2$, distances $D_3$ and $D_4$ less than 500 nm can introduce the effect of parasitic capacitance from between electrode fingers 108 and 112 and electrode bars 114 and 110, respectively, into the capacitance measurements, resulting in measurement errors in MEMS thermal sensor 100.

In some embodiments, instead of, or in addition to, electrode fingers 108 and 112 with rectangular-shaped profile along an XY-plane as shown in FIG. 1C. MEMS thermal sensor 100 can have electrode fingers 408 and 412 with trapezoidal-shaped profiles along an XY-plane as shown in FIG. 4 and/or electrode fingers 508 and 512 with trapezoidal-shaped profiles along an XY-plane as shown in FIG. 5. FIGS. 4-5 illustrate top plan views of MEMS thermal sensor 100 with alternate structures of electrode fingers 108 and 112. The discussion of electrode fingers 108 and 112 applies to electrode fingers 408 and 412 and/or 508 and 512, respectively, unless mentioned otherwise. The trapezoidal-shaped profiles of electrode fingers 408 and 412 taper down along a Y-axis from fixed ends 408b and 412b towards free ends 408a and 412a respectively. In contrast, the trapezoidal-shaped profiles of electrode fingers 508 and 512 taper down along a Y-axis from free ends 508a and 512a towards fixed ends 508b and 512b.

In some embodiments, each electrode finger 408 can have a ratio $R_1$ of a dimension of free end 408a along an X-axis to a dimension of fixed end 408b along an X-axis ranging from about 1:1.1 to about 1:5 (e.g., about 1:1.2, about 1:1.5, about 1:1.7, about 1:2, about 1:2.2, about 1:2.5, about 1:3, about 1:3.5, about 1:4, about 1:4.2, about 1:4.5, or about 1:4.7). Each electrode finger 412 can have a ratio $R_2$ of a dimension of free end 412a along an X-axis to a dimension of fixed end 412b along an X-axis equal to or greater than ratio $R_1$. In some embodiments, each electrode finger 508 can have a ratio $R_3$ of a dimension of fixed end 508b along an X-axis to a dimension of free end 508a along X-axis ranging from about 1:1.1 to about 1:5 (e.g., about 1:1.2, about 1:1.5, about 1:1.7, about 1:2, about 1:2.2, about 1:2.5, about 1:3, about 1:3.5, about 1:4, about 1:4.2, about 1:4.5, or about 1:4.7). Each electrode finger 512 can have a ratio $R_4$ of a dimension of fixed end 512b along an X-axis to a dimension of free end 512a along an X-axis equal to or greater than ratio $R_3$.

Referring to FIGS. 1A-1C, MEMS thermal sensor 100 can further include sensing elements 116. Each sensing element 116 can be disposed on a supporting element 120 and coupled to a pair of adjacent electrode fingers 108 with supporting element 120 and a pad layer 122. Pad layer 122 can include second conductive layer 122a and second buffer layer 122b similar in material composition to first conductive layer 124a and first buffer layer 124b, respectively. Sensing elements 116 can be configured to expand (e.g., linearly expand) or contract based on temperature sensed from an object and/or an environment within which MEMS thermal sensor 100 can be placed. Linear expansion of sensing elements 116 can reduce their curvatures and/or increase their radii of curvatures (i.e., make sensing elements 116 less curved; not shown), while linear contraction of sensing elements 116 can increase their curvatures and/or reduce their radii of curvatures (i.e., make sensing elements 116 more curved; not shown).

In case of linear expansion, each linearly expanded sensing element 116 can exert shear or lateral forces in directions 128A and 128B along an X-axis on the pair of electrode fingers 108 it is coupled to. Such shear or lateral forces can cause the pair of electrode fingers 108 to bend away from each other as shown with dashed lines in FIGS. 1B-1C. In case of linear contraction, each linearly contracted sensing element 116 can exert shear or lateral forces in directions 128C and 128D along an X-axis on the pair of electrode fingers 108 such that the pair of electrode fingers 108 bend towards each other as shown with solid black lines in FIGS. 1B-1C. Thus, the curved configuration of sensing elements 116 can enable bidirectional mechanical movements of each electrode fingers 108, resulting in wider range of mechanical movements compared to sensors with non-curved sensing elements, which can cause mechanical movement of each electrode fingers in one direction. Even though the dashed and solid black lines in FIGS. 1B-1C illustrate the bent electrode fingers 108 to have linear side profiles, electrode fingers 108 after bending can have curved side profiles, according to some embodiments.

Referring to FIGS. 1B-1C, the maximum displacement M of each electrode finger 108 from its original position due to the shear or lateral forces can be defined as the range of mechanical movement of electrode fingers 108. In some embodiments, the range of mechanical movements of each electrode finger 108 coupled to a corresponding sensing element 116 can be from about 1 nm to about 100 μm (e.g., about 5 nm, about 10 nm, about 20 nm, about 50 nm, about 100 nm, about 200 nm, about 500 nm, about 700 nm, about 900 nm, about 1 μm, about 5 μm, about 7 μm, about 10 μm, about 20 μm, about 50 μm, about 70 μm, or about 90 μm). In some embodiments, the range of mechanical movements of each electrode finger 108 coupled to a corresponding sensing element 116 is increased by about 10% to about 50% (e.g., about 15%, about 20%, about 25%, about 30%, about 35%, about 40%, or 45%) compared to sensors with non-curved sensing elements. For effective displacement of electrode fingers 108, sensing elements 116 can be placed closer to free ends 108a than to fixed ends 108b of electrode fingers 108.

The bending of electrode fingers 108 in response to the temperature sensed by sensing elements 116 can cause the spacing between electrode fingers 108 and 112 to change and result in a change in capacitance between sensing electrodes 104 and 106. Based on the change in capacitance, the temperature sensed by sensing elements 116 can be determined using an electronic circuitry and/or processor (not shown) coupled to measurement contact pads 124 and 126. In some embodiments, the electronic circuitry and/or processor can be parts of MEMS thermal sensor 100 or can be external elements coupled to MEMS thermal sensor 100.

Referring to FIGS. 1A-1B, in some embodiments, each sensing element 116 can include a first element 130 disposed on a second element 132. First and second elements 130 and 132 can each have temperature sensitive materials with thermal expansion coefficient values that are different from each other. As a result, the linear expansion or contraction of each sensing element 116 in response to temperatures can depend on the combined thermal effect on first and second elements 130 and 132. For example, sensing element 116 can be linearly expanded (i.e., sensing element 116 can be less curved) when first element 130 expands less than second element 132 in response to certain temperatures and/or sensing element 116 can be linearly contracted (i.e., sensing element 116 can be more curved) when first element 130 expands more than second element 132 in response to certain temperatures.

First and second elements 130 and 132 can have similar or different material composition from each other. In some embodiments, first and second elements 130 and 132 can include temperature sensitive materials with thermal expansion coefficient values ranging from about 5 μm/m-° C. to about 30 μm/m-° C. (e.g., about 6 μm/m-° C., about 8 μm/m-° C., about 10 μm/m-° C., about 12 μm/m-° C., about 15 μm/m-° C., about 17 μm/m-° C., about 20 μm/m-° C., about 22 μm/m-° C., about 23 μm/m-° C., about 25 μm/m-° C., or about 27 μm/m-° C.). There can be a difference of about 0.1 μm/m-° C. to about 25 μm/m-° C. (e.g., about 0.2 μm/m-° C., about 0.5 μm/m-° C., about 0.7 μm/m-° C., about 0.9 μm/m-° C., about 1 μm/m-° C., about 1.5 μm/m-° C., about 3 μm/m-° C., about 5 μm/m-° C., about 7 μm/m-° C., about 10 μm/m-° C., about 12 μm/m-° C., about 15 μm/m-° C., about 17 μm/m-° C., about 20 μm/m-° C., or about 23 μm/m-° C.) between the thermal expansion coefficient values of materials in first and second elements 130 and 132.

In some embodiments, first and second elements 130 and 132 can include a metal, a metal alloy, a semiconductor, or a combination thereof. In some embodiments, first and second elements 130 and 132 can include Si, Ge, Al, Cu, Fe, Ni, Cr, Pt, W, Ti, Ta, Rh, Co, Ag, Sn, AlCu, CuNi, PtRh, NiSi, CoSi, TiAl, aluminum alloy, copper alloy, nickel alloy, stainless steel, or a combination thereof. In some embodiments, the materials of first and second elements 130 and 132 can be doped with a material, such as silicon, germanium, indium, phosphorus, boron, nitrogen, or a combination thereof. First and second elements can have different dopant material and doping concentrations from each other. In some embodiments, supporting element 120 can have similar material composition and thermal expansion coefficient value as first element 130 or second element 132. In some embodiments, supporting element 120 can be different from first and second elements 130 and 132 in material composition and can have a material with a thermal expansion coefficient value that is less than about 5 μm/m-° C. (e.g., about 4 μm/m-° C., about 3 μm/m-° C., about 2 μm/m-° C., about 1 μm/m-° C., about 0.5 μm/m-° C., about 0.2 μm/m-° C., or about 0.1 μm/m-° C.) or substantially equal to zero. In some embodiments, supporting element 120 can have material similar to the material of first conductive layers 124a and 126a.

At room temperature (e.g., about 20° C., about 23° C., or about 25° C.), the radius of curvature of first element 130 can be equal to or greater than the radius of curvature of second element 132 and the radius of curvature of second element 132 can be equal to or greater than the radius of curvature of supporting element 120. In some embodiments, first and second elements 130 and 132 can each have a radius of curvature at room temperature ranging from about 100 nm to about 25 mm (e.g., about 200 nm, about 500 nm, about 700 nm, about 1 μm, about 5 μm, about 10 μm, about 20 μm, about 50 μm, about 70 μm, 90 μm, about 100 μm, 250 μm, about 500 μm, about 750 μm, about 1 mm, about 2 mm, about 4 mm, about 10 mm, about 15 mm, or about 20 mm). In some embodiments, each of sensing elements 116 can have one or more elements with temperature sensitive materials disposed on first element 130. The one or more elements can have radii of curvatures greater than the radius of curvature of first element 130 at room temperature. The thermal expansion coefficient values of the one or more elements can be different from the thermal expansion coefficient values of first and/or second elements 130 and 132.

Referring to FIG. 1B, first and second elements 130 and 132 can have thicknesses 130t and 132t, respectively, at their centers along their common central axis 134, which is substantially parallel to a Z-axis. In some embodiments, thicknesses 130t and 132t can be equal to or different from each other and can range from about 100 nm to about 10 µm (e.g., about 200 nm, about 300 nm, about 500 nm, about 700 nm, about 900 nm, about 1 µm, about 2 µm, about 5 µm, about 7 µm, or about 9 µm). Such range of thickness can help first and second elements 130 and 132 to linearly expand or contract more effectively in response to temperature variations than thicknesses outside this range, thus resulting in a more sensitive MEMS thermal sensor 100. In some embodiments, first and second elements 130 and 132 can have substantially uniform thicknesses, such as thicknesses 130t and 132t, respectively, across their curvatures. In some embodiments, first and second elements 130 and 132 can have non-uniform thicknesses across their curvatures. Thicknesses of first and second elements 130 and 132 can decrease from their central axis 134 towards their edges, which are coupled to electrode fingers 108.

Referring to FIG. 1C, first and second elements 130 and 132 each can have a horizontal dimension $L_3$ (e.g., length) along an X-axis and a horizontal dimension $W_4$ (e.g., width) along a Y-axis, each horizontal dimension ranging from about 100 nm to about 100 µm (e.g., about 200 nm, about 500 nm, about 700 nm, about 1 µm, about 5 µm, about 10 µm, about 20 µm, about 50 µm, about 70 µm or about 90 µm). In some embodiments, dimension $L_3$ can be equal to or greater than dimension $W_4$.

FIGS. 6-14 illustrate different top plan views of first element 130, according to some embodiments. First element 130 can have a rectangular-shaped portion with horizontal dimensions $L_3$ and $W_4$ (FIG. 6) in its top plan view. In some embodiments, instead of the solid rectangular portion of FIG. 6, first element 130 can have a rectangular portion with horizontal dimensions $L_3$ and $W_4$ and openings 736 (FIG. 7), 836 (FIG. 8), 936 (FIG. 9), 1036 (FIG. 10), or 1136 (FIG. 11) in its top plan view. Openings 736 can each have a dimension along an X-axis smaller than dimension $L_3$ and/or a dimension along a Y-axis smaller than dimension $W_4$ and can range from about 100 nm to about 10 µm (e.g., about 200 nm, about 500 nm, about 700 nm, about 1 µm, about 5 µm, or about 7 µm). Openings 836 can each have a radius smaller than dimensions $L_3$ and/or $W_4$ and can range from about 100 nm to about 10 µm (e.g., about 200 nm, about 500 nm, about 700 nm, about 1 µm, about 5 µm, or about 7 µm).

In some embodiments, openings 936 can each have a dimension along an X-axis smaller than dimension $L_3$ and can range from about 100 nm to about 90 µm (e.g., about 200 nm, about 500 nm, about 700 nm, about 1 µm, about 5 µm, about 10 µm, about 20 µm, about 50 µm, or about 70 µm). Openings 936 can each have a dimension along a Y-axis smaller than dimension $W_4$ and can range from about 100 nm to about 5 µm (e.g., about 200 nm, about 500 nm, about 700 nm, about 1 µm, about 2 µm, or about 4 µm). In some embodiments, openings 1036 can each have a dimension along an X-axis equal to dimension $L_3$ and can range from about 100 nm to about 100 µm (e.g., about 200 nm, about 500 nm, about 700 nm, about 1 µm, about 5 µm, about 10 µm, about 20 µm, about 50 µm, about 70 µm or about 90 µm). Openings 1036 can each have a dimension along a Y-axis smaller than dimension $W_4$ and can range from about 100 nm to about 5 µm (e.g., about 200 nm, about 500 nm, about 700 nm, about 1 µm, about 2 µm, or about 4 µm).

Referring to FIG. 12, in some embodiments, first element 130 can have first and second rectangular portions 1238a-1238b and a curved portion 1240 connecting first and second rectangular portions 1238a-1238b in its top plan view. First and second rectangular portions 1238a-1238b can be separated from each other along an X-axis by a dimension $L_4$, smaller than dimension $L_3$, ranging from about 100 nm to about 80 µm (e.g., about 200 nm, about 500 nm, about 700 nm, about 1 µm, about 5 µm, about 10 µm, about 20 µm, about 50 µm, or about 70 µm). Referring to FIGS. 13-14, instead of curved portion 1240, first element 130 can have one or two bars 1242 diagonally connecting first and second rectangular portions 1238a-1238b, according to some embodiments. Linear expansion or contraction of first element 130 can be easier with a structure with one of top plan views shown in FIGS. 7-14 as compared to that of FIG. 6. For ease of linear expansion or contraction, first element 130 can have a structure with one of top plan views shown in FIGS. 7-14 for materials with large thermal expansion coefficient values, such as thermal expansion coefficient values greater than 10 µm/m-° C. (e.g., about 6 µm/m-° C., about 8 µm/m-° C., about 10 µm/m-° C., about 12 µm/m-° C., about 15 µm/m-° C., about 17 µm/m-° C., about 20 µm/m-° C., about 22 µm/m-° C., about 23 µm/m-° C., about 25 µm/m-° C., or about 27 µm/m-° C.), according to some embodiments. Second element 132 can have top plan views similar to the top plan views of first element 130 discussed above with reference to FIGS. 6-14.

FIGS. 15-20 illustrate cross-sectional views of MEMS thermal sensor 100 with different configurations of sensing elements 116, according to some embodiments. Sensing elements 116 and supporting elements 120 can be coupled to pad layers 122 to have their convex sides facing electrode fingers 108 (shown in FIG. 15), instead of their concave sides facing electrode fingers 108 (shown in FIGS. 1A-1B), according to some embodiments. Sensing elements 116 and/or second element 132 can be coupled to pad layers 122 through supporting elements 120 (shown in FIGS. 16-17), instead of being physically connected to top surfaces of pad layers 122 (shown in FIGS. 1A-1B), according to some embodiments. Supporting elements 120 can have horizontal dimensions $W_5$ along an X-axis smaller than (shown in FIG. 16) or equal to (shown in FIG. 17) horizontal dimensions $W_6$ of pad layers 122 along an X-axis. In some embodiments, horizontal dimensions $W_6$ of pad layers 122 can be equal to (shown in FIGS. 15-17) or greater than (shown in FIG. 18) horizontal dimensions $W_2$ of electrode fingers 108 along an X-axis. In some embodiments, sensing elements 116 can be coupled to electrode fingers 108 without second buffer layers 122b (shown in FIG. 19). In some embodiments, sensing elements 116 can be physically connected to electrode fingers 108 without supporting elements 120 and pad layers 122 as shown in FIG. 20.

Figure 21:
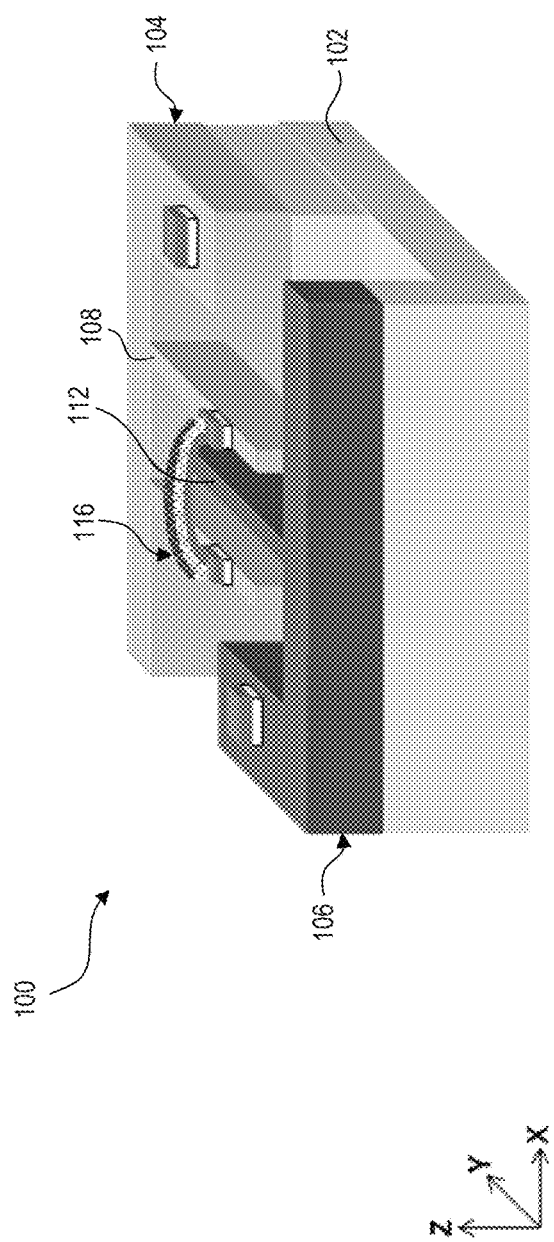
Figure 22:
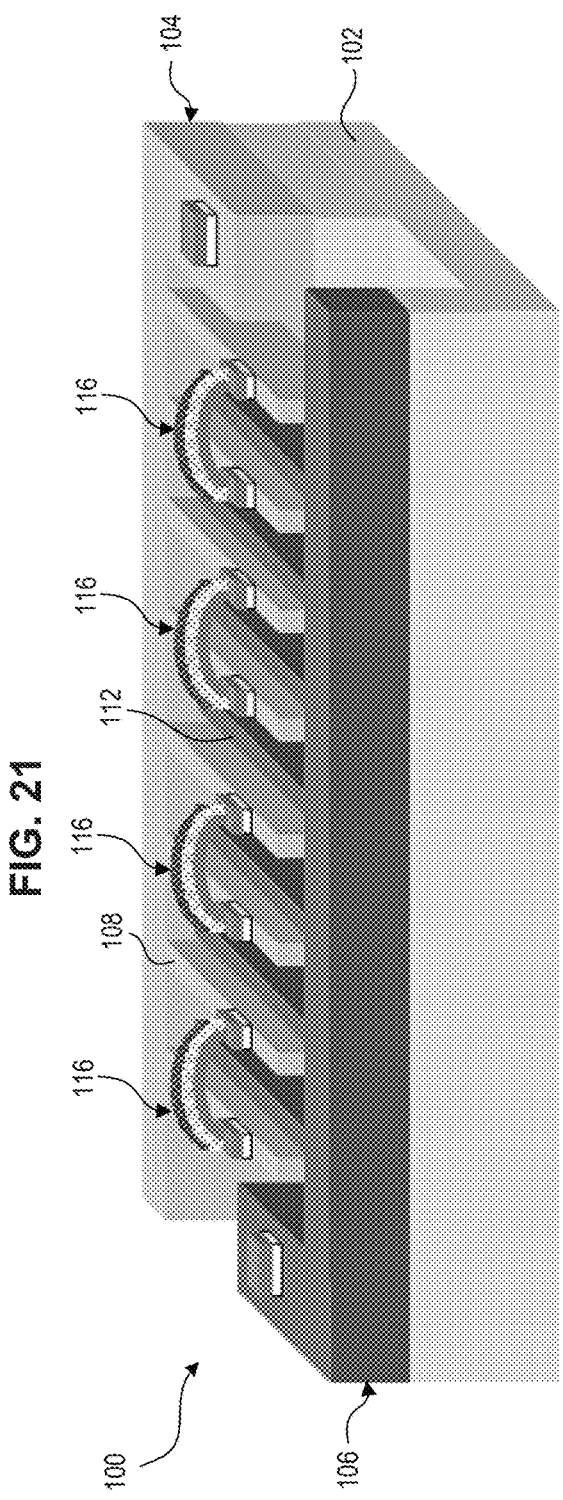
Figure 25:
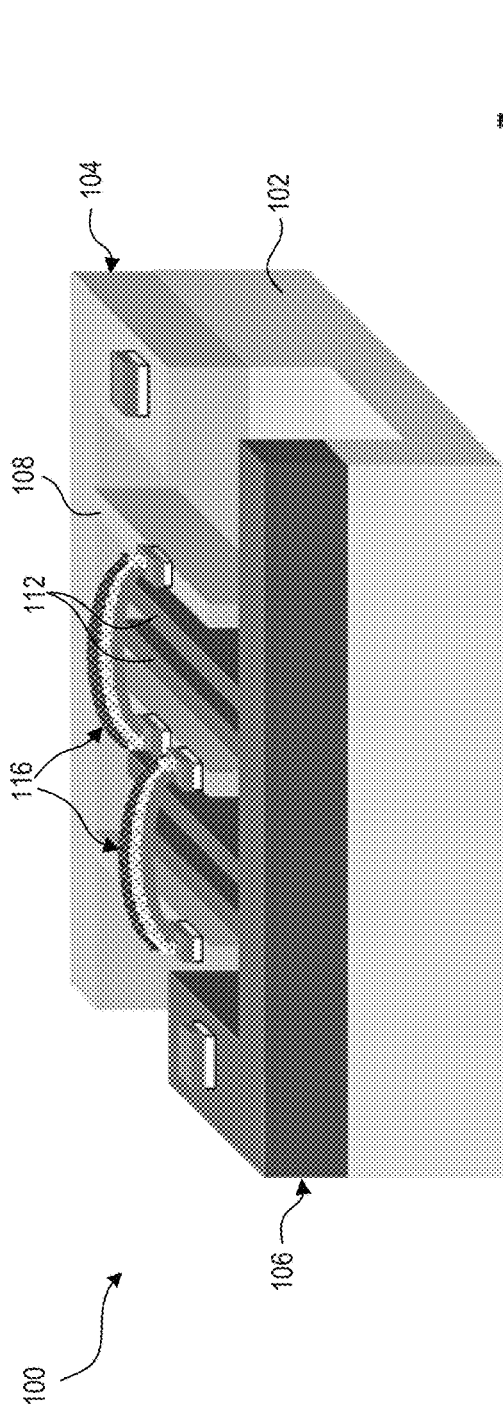
Figure 26:
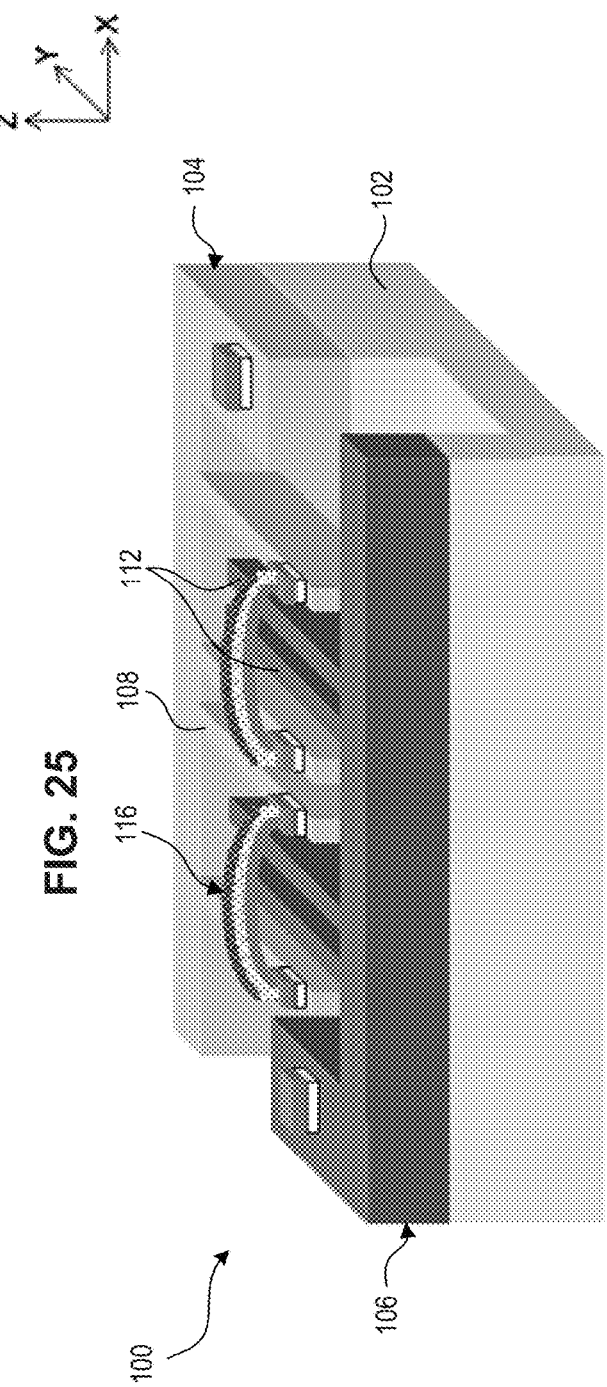

FIGS. 21-28 illustrate that MEMS thermal sensor 100 can have other configurations of sensing elements 116 and electrode fingers 108 and 112, instead of the configuration shown in FIG. 1A, according to some embodiments. MEMS thermal sensor 100 can have one or more sensing elements 116 coupled to pairs of electrode fingers 108 as shown in FIGS. 21-22. Adjacent pairs of electrode fingers 108 with sensing elements 116 can have one (shown in FIG. 22) or more (not shown) electrode fingers 112 between them. MEMS thermal sensor 100 can have sensing elements 116 coupled to pairs of electrode fingers 108, where two sensing elements 116 can be coupled to a common electrode finger 108 as shown in FIGS. 23-24. FIG. 24 further illustrates that a sensing elements 116 can be coupled to a pair of electrode fingers 112. In some embodiments, MEMS thermal sensor 100 can have more than one electrode fingers 112 between each pair of electrode fingers 108 (shown in FIGS. 25-26) and/or more than one electrode fingers 108 between each pair of electrode fingers 112 (shown in FIG. 26-28). FIGS. 27-28 further illustrates that sensing elements 116 can be coupled to pairs of electrode fingers 108 and 112.

Referring to FIGS. 29-30, MEMS thermal sensor 100 can additionally or optionally include a coating layer 2944 on surfaces of substrate 102 and sensing electrodes 104 and 106, according to some embodiments. Coating layer 2944 can be configured to reduce or prevent stiction between substrate 102 and electrode fingers 108 and 112 and/or between electrode fingers 108 and 112. Such phenomenon of stiction can impede or even prevent the proper operation of MEMS thermal sensor 100 and can be mitigated with coating layer 2944.

Coating layer 2944 can have a thickness $2944t$ ranging from about 10 nm to about 1 µm (e.g., about 20 nm, about 50 nm, about 80 nm, about 100 nm, about 200 nm, about 500 nm, about 700 nm, or about 900 nm). In some embodiments, coating layer 2944 can include one or more self-assembled monolayers or an organic-based material. In some embodiments, the one or more self-assembled monolayers can include silane molecules and alky-chains, or fluorinated alky-chains. In some embodiments, the one or more self-assembled monolayers can include octadecyltrichlorosilane (OTS; $C_{18}H_{37}Cl_3Si$), perfluorodecyltrichlorosilane (FDTS; $C_{10}H_4F_{17}Cl_3Si$), perfluoroctyltrichlorosilane (FOTS; $C_8H_4Cl_3F_{13}Si$), tetrahydrooctylmethyldichlorosilane (FO-MDS; $C_9H_7Cl_2F_{13}Si$), tetrahydrooctyltriethoxysilane (FO-TES; $C_{14}H_{19}F_{13}O_3Si$), or a combination thereof.

Figure 31:
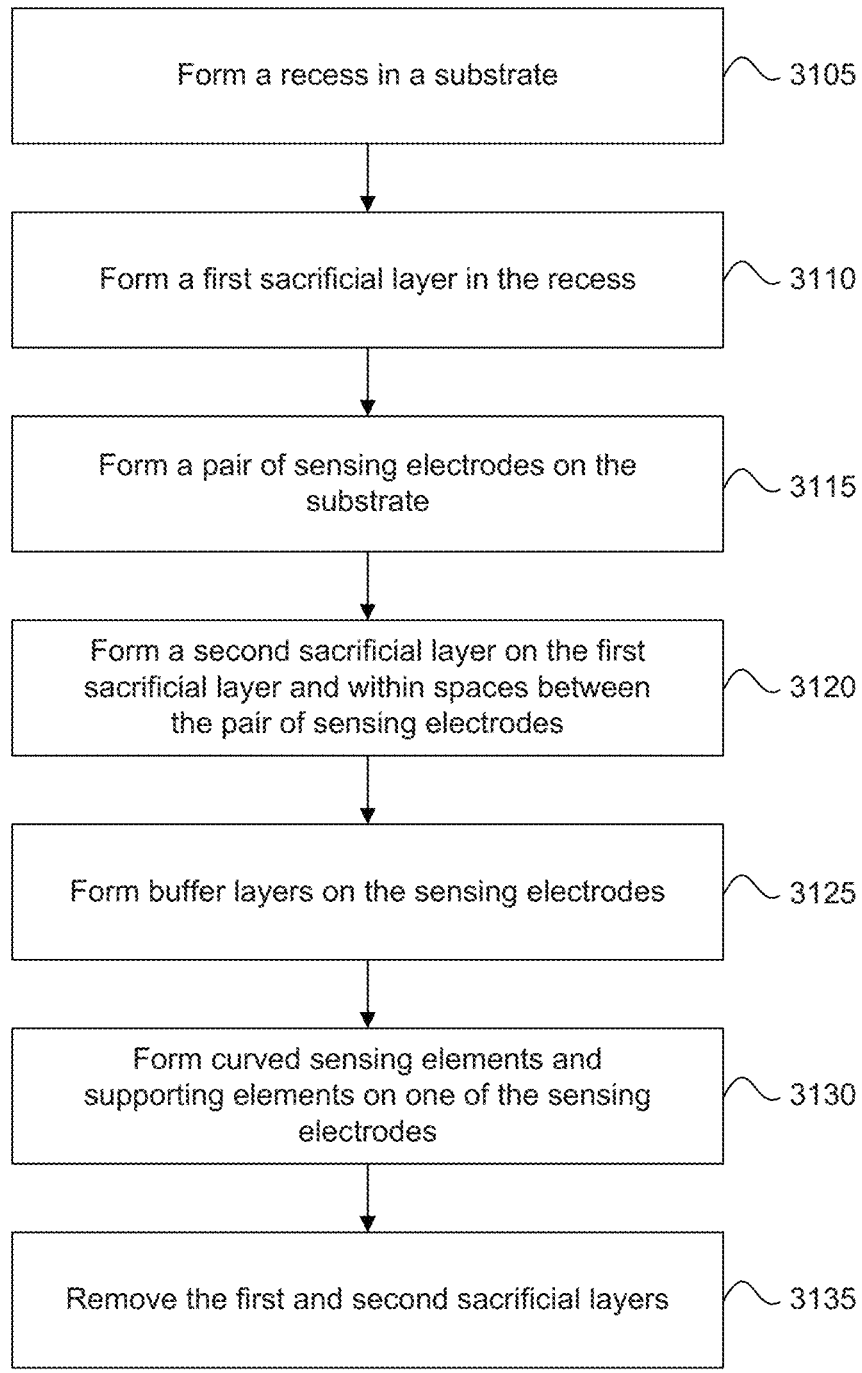
FIG. 31 is a flow diagram of a method for fabricating a MEMS thermal sensor, in accordance with some embodiments.
Figure 34A:
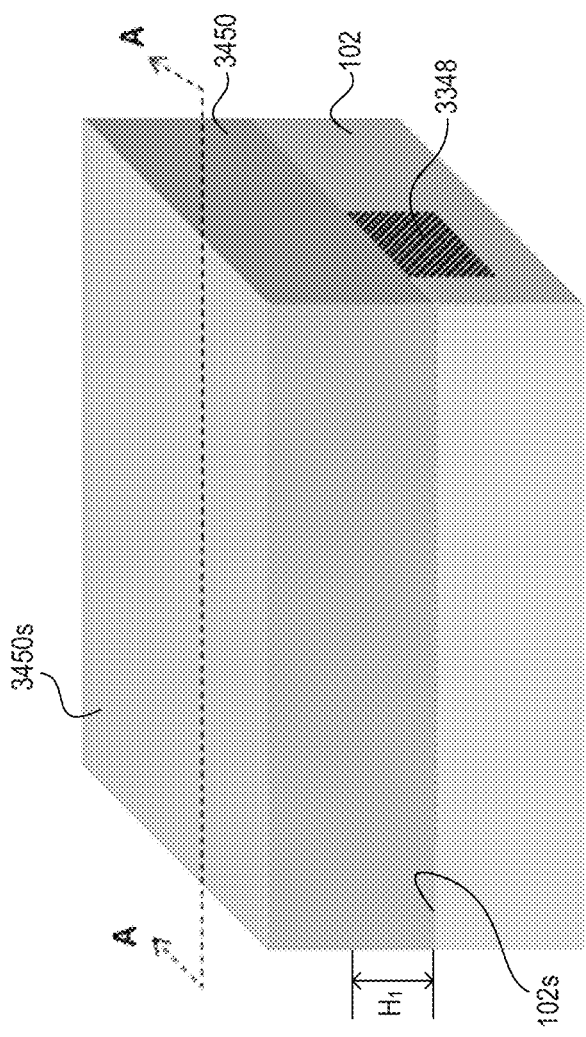
Figure 34B:
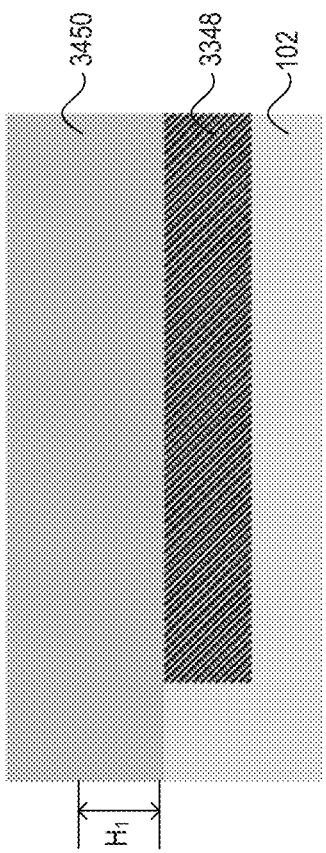

FIG. 31 is a flow diagram of an example method 3100 for fabricating MEMS thermal sensor 100, according to some embodiments. For illustrative purposes, the operations illustrated in FIG. 3100 will be described with reference to the example fabrication process for fabricating MEMS thermal sensor 100 as illustrated in FIGS. 32A-44A and 32B-44B. FIGS. 32A-44A are isometric views of MEMS thermal sensor 100 at various stages of its fabrication, and FIGS. 32B-44B are cross-sectional views along lines A-A of respective structures of FIGS. 32A-44A, according to some embodiments. Operations can be performed in a different order or not performed depending on specific applications. It should be noted that method 3100 may not produce a complete MEMS thermal sensor 100. Accordingly, it is understood that additional processes can be provided before, during, and after method 3100, and that some other processes may only be briefly described herein. Elements in FIGS. 32A-44A and 32B-44B with the same annotations as elements in FIGS. 1A-1C are described above.

In operation 3105, a recess is formed in a substrate. For example, as shown in FIGS. 32A-32B, a recess 3246 can be formed in substrate 102. Recess 3246 can have a vertical dimension $D_1$ (e.g., depth) along a Z-axis ranging from about 500 nm to about 500 µm (e.g., about 600 nm, about 700 nm, about 1 µm, about 5 µm, about 10 µm, about 20 µm, about 50 µm, about 70 µm, about 90 µm, about 100 µm, about 200 µm, about 250 µm, about 300 µm, or about 400 µm) and a horizontal dimension $L_5$ (e.g., length) along an X-axis ranging from about 100 nm to about 5 mm (e.g., about 500 nm, about 1 µm, about 10 µm, about 50 µm, about 100 µm, 250 µm, about 500 µm, about 750 µm, about 1 mm, about 2 mm, or about 4 mm).

The formation of recess 3246 can include depositing a hard mask layer (not shown) on substrate 102, patterning the hard mask layer on substrate 102 to form a patterned hard mask layer, and etching substrate 102 through the patterned hard mask layer. In some embodiments, the hard mask layer can be a thin film including silicon oxide formed, for example, using a thermal oxidation process. In some embodiments, hard mask layer can be formed of silicon nitride using, for example, low pressure chemical vapor deposition (LPCVD) or plasma enhanced CVD (PECVD). The hard mask layer can be patterned by photolithography including photoresist coating (e.g., spin-on coating), soft baking, mask aligning, exposure, post-exposure baking, developing the photoresist, drying (e.g., hard baking), or a combination thereof. The etching of substrate 102 through the patterned hard mask layer can be performed using, for example, a dry etch process, a wet etch process, or a combination thereof. The dry etch process can use reactive ion etching using a chlorine or fluorine based etchant.

Referring to FIG. 31, in operation 3110, a first sacrificial layer is formed in the recess. For example, as shown in FIGS. 33A-33B, a first sacrificial layer 3348 can be formed within recess 3246. First sacrificial layer 3348 can include an insulating material, such as an oxide, a nitride, or a combination thereof. In some embodiments, the insulating material can include, for example, silicon oxide, silicon nitride, silicon oxynitride, fluoride-doped silicate glass (FSG), or a low-k dielectric material. The formation of first sacrificial layer 3348 can include depositing the insulating material on the structure of FIG. 32A and removing excess insulating material from top surface $102s$ of substrate 102. In some embodiments, the insulating material can be deposited using a flowable chemical vapor deposition (FCVD) process, a high-density-plasma (HDP) CVD process, using silane ($SiH_4$) and oxygen ($O_2$) as reacting precursors, or a sub-atmospheric CVD (SACVD) process, where process gases can include tetraethoxysilane (TEOS) and/or ozone ($O_3$).

The deposition of the insulating material can be followed by the removal of excess insulating material from top surface $102s$ using, for example, a chemical mechanical polishing (CMP) process or an etch back process. The CMP process can include planarizing the deposited insulating material such that top surface $3348s$ of first sacrificial layer 3348 can be substantially coplanar with top surface $102s$ of substrate 102. The etch back process can include one or more dry etch processes, wet etch processes, and/or plasma etch processes to remove the excess insulating material and to substantially coplanarize top surfaces $3348s$ and $102s$.

In some embodiments, the one or more dry etch processes can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the one or more wet etch processes can include using a diluted hydrofluoric acid (DHF) treatment, an ammonium peroxide mixture (APM), a sulfuric peroxide mixture (SPM), hot deionized water (DI water), or a combination thereof. In some embodiments, the one or more wet etch process can include using ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

Referring to FIG. 31, in operation 3115, a pair of sensing electrodes are formed on substrate 102. For example, as shown in FIGS. 34A-34B and 35A-35B, the formation of sensing electrodes 104 and 106 on substrate 102 can include bonding a wafer 3450 to top surface 102s of the structure of FIG. 33A, followed by a wafer thinning process to thin down wafer 3450 and patterning of the thinned down wafer 3450 to form sensing electrodes 104 and 106. Wafer 3450 can be a semiconductor material such as, but not limited to, silicon. In some embodiments, wafer 3450 can include an elementary semiconductor, such as silicon or germanium; a compound semiconductor including silicon carbide, gallium arsenide, gallium phosphide, indium phosphide, indium arsenide, and/or indium antimonide; an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or a combination thereof.

In some embodiments, wafer 3450 can include a metallic material (e.g., aluminum (Al), copper (Cu), aluminum copper (AlCu), iron (Fe), nickel (Ni), stannum (Sn), copper nickel (CuNi), chromium (Cr), platinum (Pt), tungsten (W), titanium (Ti), tantalum (Ta), rhodium (Rh), platinum rhodium (PtRh), tantalum nitride (TaN), nickel silicide (NiSi), cobalt (Co), cobalt silicide (CoSi), silver (Ag), tantalum carbide (TaC), titanium aluminum (TiAl), metal alloys, and/or combinations thereof), a metal alloy, or doped or undoped polysilicon. In some embodiments, wafer 3450 can include a conductive or semiconductive material with an electrical resistivity ranging from about $1\times10^{-15}$ Ωm to about $1\times10^{15}$ Ωm (e.g., about $1\times10^{-12}$ Ωm, about $1\times10^{10}$ Ωm, about $1\times10^{-9}$ Ωm, about $1\times10^{-8}$ Ωm, about $1\times10^{-7}$ Ωm, about $1\times10^{-6}$ Ωm, about $1\times10^{-5}$ Ωm, about $1\times10^{-4}$ Ωm, about $1\times10^{-2}$ Ωm, about $1\times10$ Ωm, about $1\times10^5$ Ωm, or $1\times10^{10}$ Ωm) at a room temperature (e.g., about 20° C., about 23° C., or about 25° C.).

Wafer 3450 can be bonded to top surface 102s using a wafer bonding process, such as fusion bonding, anodic bonding, eutectic bonding, or a suitable wafer bonding process. In case of fusion bonding, the bonding process can include bringing wafer 3450 and top surface 102s into physical contact, followed by an annealing process that forms a bond (e.g., Si/Si bond, oxide/oxide bond, or oxide/Si bond) between wafer 3450 and top surface 102s. The annealing process can be performed at a temperature ranging from about 200° C. to about 480° C. (e.g., about 210° C., about 220° C., about 250° C., about 280° C., about 300° C., about 320° C., about 340° C., about 350° C., about 400° C., or about 450° C.). The fusion bonding process can further include applying a force on top surface 3450s of wafer 3450 for a period of time before or during the annealing process. The force can range from about 0.1 N to about 5 N (e.g., about 0.5 N, about 2 N, about 3 N, or about 4 N) and the period of time can range from about 10 seconds to about 10 minutes (e.g., about 30 seconds, about 1 min, about 2 min, about 5 min, or about 7 min). In various embodiments, wafer 3450 can be bonded to top surface 102s with a polysilicon layer as a bonding interface at interface 3452 between wafer 3450 and top surface 102s.

The wafer bonding process can be followed by a wafer thinning process to thin down the bonded wafer 3450 to a vertical dimension $H_1$ along a Z-axis (e.g., height) ranging from about 100 nm to about 300 μm (e.g., about 200 nm, about 500 nm, about 700 nm, about 1 μm, about 5 μm, about 10 μm, about 20 μm, about 50 μm, about 70 μm, about 90 μm, about 100 μm, about 200 μm, or about 250 μm). The wafer thinning process can include a grinding process, a polishing process, and/or an etching process (e.g., wet etch or dry etch) performed on top surface 3450s of bonded wafer 3450.

The grinding process can include grinding bonded wafer 3450 with a grinding tool for a period of time ranging from about 30 seconds to about 10 minutes (e.g., about 40 seconds, about 1 min, about 2 min, about 5 min, or about 7 min). The polishing process can include performing a CMP process on top surface 3450s of bonded wafer 3450. The etching process can include a dry etch (e.g., a plasma etch) or a wet etch process. The wet etch process can include etching top surface 3450s with an etchant having hydrofluoric acid (HF), nitric acid ($HNO_3$) or a combinations thereof. In some embodiments, the etchant can include $HNO_3$ with a concentration in a range from about 50% to about 90% (e.g., about 60%, about 70%, or about 80%). In some embodiments, the etchant can include $HNO_3$ with a concentration in a range from about 10% to about 50% (e.g., about 20%, about 30%, or about 40%) mixed with hydrofluoric acid (HF) with a concentration in a range from about 10% to about 50% (e.g., about 20%, about 30%, or about 40%). In some embodiments, bonded wafer 3450 can be thinned down by using the grinding process, followed by the polishing process, and then the etching process.

The wafer thinning process can be followed by a patterning process to form sensing electrodes 104 and 106 as shown in FIGS. 35A-35B. The patterning process can include forming patterned photoresist on thinned down wafer 3450 (not shown) using photolithography and removing wafer portions of thinned down wafer 3450 not protected by the patterned photoresist to form sensing electrodes 104 and 106. The wafer portions can be removed by a dry etch process (e.g., reactive ion etch) or a wet etch process. First sacrificial layer 3348 can act as an etch stop layer during the etch of the wafer portions.

Referring to FIG. 31, in operation 3120, a second sacrificial layer is formed on the first sacrificial layer and within spaces between the pair of sensing electrodes. For example, as shown in FIGS. 36A-36B, a second sacrificial layer 3656 can be formed on first sacrificial layer 3348 and within spaces 3554 (shown in FIGS. 35A-35B) between sensing electrodes 104 and 106. Second sacrificial layer 3656 can include an insulating material, such as an oxide, a nitride, or a combination thereof. In some embodiments, the insulating material can include, for example, silicon oxide, silicon nitride, silicon oxynitride, fluoride-doped silicate glass (FSG), or a low-k dielectric material. In some embodiments, the material of second sacrificial layer 3656 can be similar to the material of first sacrificial layer 3348. The formation of second sacrificial layer 3656 can include depositing the insulating material on the structure of FIG. 35A and removing excess insulating material from top surfaces 104s and 106s of sensing electrodes 104 and 106, respectively. In some embodiments, the insulating material can be deposited using a flowable chemical vapor deposition (FCVD) process, a high-density-plasma (HDP) CVD process, using silane (SiH$_4$) and oxygen (O$_2$) as reacting precursors, or a sub-atmospheric CVD (SACVD) process, where process gases can include tetraethoxysilane (TEOS) and/or ozone (O$_3$).

The deposition of the insulating material can be followed by the removal of excess insulating material from top surfaces 104s and 106s using, for example, a chemical mechanical polishing (CMP) process or an etch back process. The CMP process can include planarizing the deposited insulating material such that top surface 3656s of second sacrificial layer 3656 can be substantially coplanar with top surface 104s and 106s. The etch back process can include one or more dry etch processes, wet etch processes, and/or plasma etch processes to remove the excess insulating material and to substantially coplanarize top surfaces 3656s, 104s, and 106s. In some embodiments, the one or more dry or wet etch processes for removing excess insulating material of second sacrificial layer 3656 can be similar to the one or more dry or wet etch processes described above for first sacrificial layer 3348.

Referring to FIG. 31, in operation 3125, buffer layers are formed on the sensing electrodes. For example, as shown in FIGS. 38A-38B, first buffer layers 124b and 126b are formed on contact regions 110a and 114a of sensing electrodes 104 and 106, respectively, and second buffer layers 122b are formed on electrode fingers 108 of sensing electrode 104. The formation of buffer layers 122b, 124b, and 126b can include blanket depositing a layer 3758 (shown in FIGS. 37A-37B) of buffer material (e.g., oxide, nitride, or a combination thereof) on the structure of FIG. 36A, followed by a patterning process. Layer 3758 can be deposited by chemical vapor deposition (CVD), low pressure CVD (LPCVD), plasma enhanced CVD (PECVD), atomic layer deposition (ALD), plasma enhanced ALD (PEALD), physical vapor deposition (PVD), e-beam evaporation, or other suitable process. In some embodiments, layer 3758 can have a vertical dimension 3758t along a Z-axis (e.g., thickness) ranging from about 100 nm to about 10 µm (e.g., about 200 nm, about 300 nm, about 500 nm, about 700 nm, about 900 nm, about 1 µm, about 2 µm, about 5 µm, about 7 µm, or about 9 µm). The patterning process can include forming a patterned photoresist (not shown) on layer 3758 using photolithography and removing portions of layer 3758 not protected by the patterned photoresist to form buffer layers 122b, 124b, and 126b. The portions of layer 3758 can be removed by a dry etch process (e.g., reactive ion etch) or a wet etch process. The dry etch process can be performed using a gas mixture having methane (CH$_4$), oxygen (O$_2$), sulfur hexafluoride (SF$_6$), argon (Ar), hydrogen (H$_2$), chlorine (Cl$_2$), boron trichloride (BCl$_3$), nitrogen trifluoride (NF$_3$), hydrogen bromide (HBr), silane, or a combination thereof. In some embodiments, operation 3125 can be optional when MEMS thermal sensor 100 can have measurement contact pads 124 and 126 that do not include respective first buffer layers 124b and 126b and have pad layer 122 that does include second buffer layer 122b.

Figure 43A:
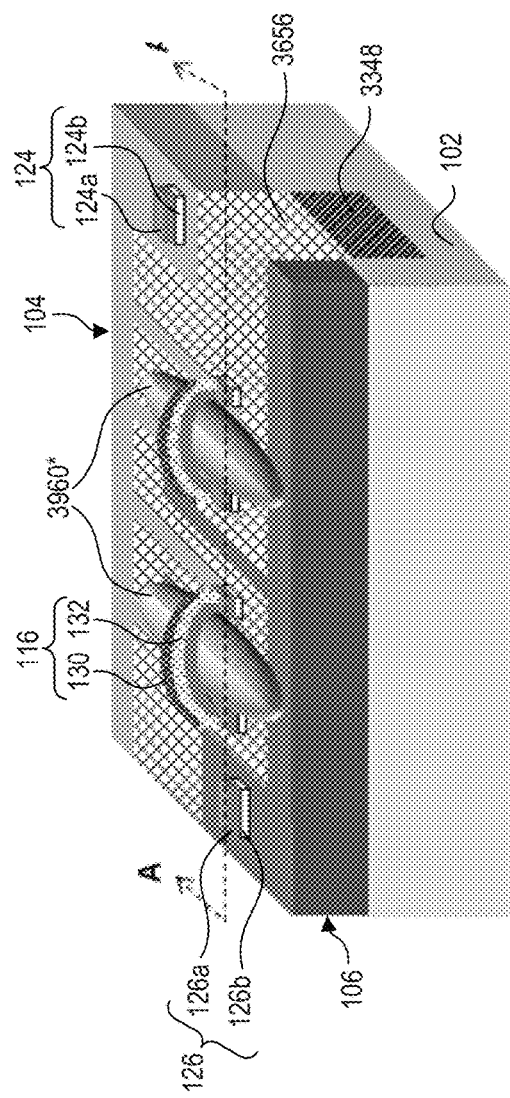
Figure 43B:
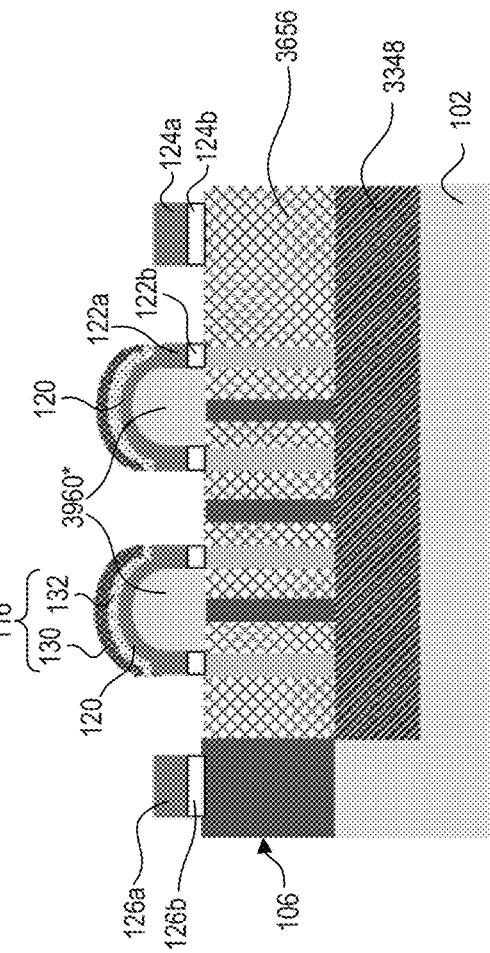

Referring to FIG. 31, in operation 3130, curved sensing elements and supporting element layers are formed on one of the sensing electrodes. For example, as shown in FIGS. 43A-43B, sensing elements 116 and supporting elements 120 are formed on second conductive layers 122a, which are formed on electrode fingers 108 of sensing electrode 104. The formation of sensing elements 116 and supporting elements 120 can include (i) forming a patterned layer 3960 (shown in FIGS. 39A-39B), (ii) performing a thermal treatment on patterned layer 3960 to form a modified patterned layer 3960* with a curved cross-section (shown in FIGS. 40A-40B), (iii) blanket depositing a supporting element layer 120* (shown in FIGS. 41A-41B) on modified patterned layer 3960*, (iv) blanket depositing a second element layer 132* (shown in FIGS. 41A-41B) on supporting element layer 120*, (v) blanket depositing a first element layer 130* (shown in FIGS. 41A-41B) on second element layer 132*, (vi) patterning first and second element layers 130* and 132* to form respective first and second elements 130 and 132 of sensing element 116 (shown in FIGS. 42A-42B), and (vii) patterning supporting element layer 120* to form supporting elements 120, first conductive layers 124a and 126a of respective measurement contact pads 124 and 126, and second conductive layers 122a of pad layers 122 (shown in FIGS. 43A-43B).

Figure 39A:
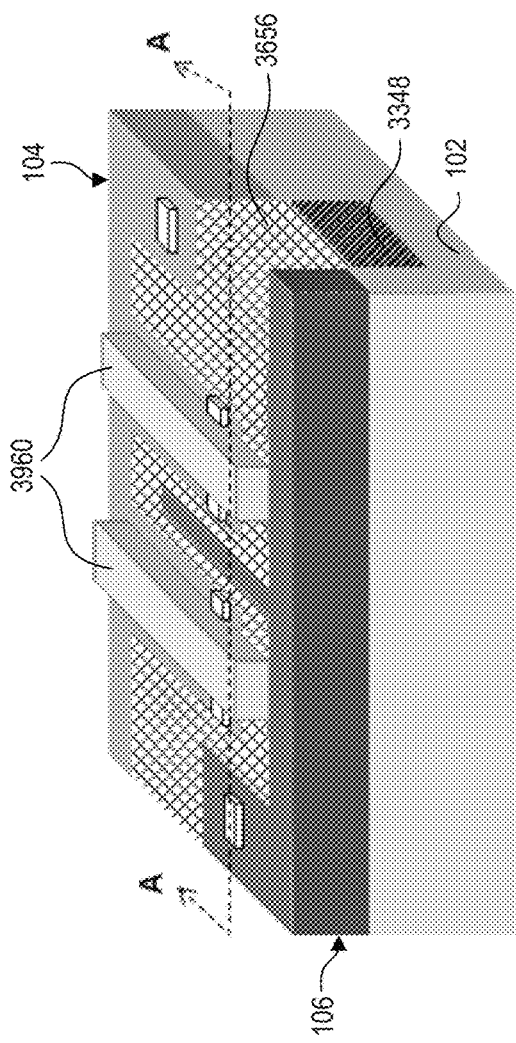
Figure 39B:
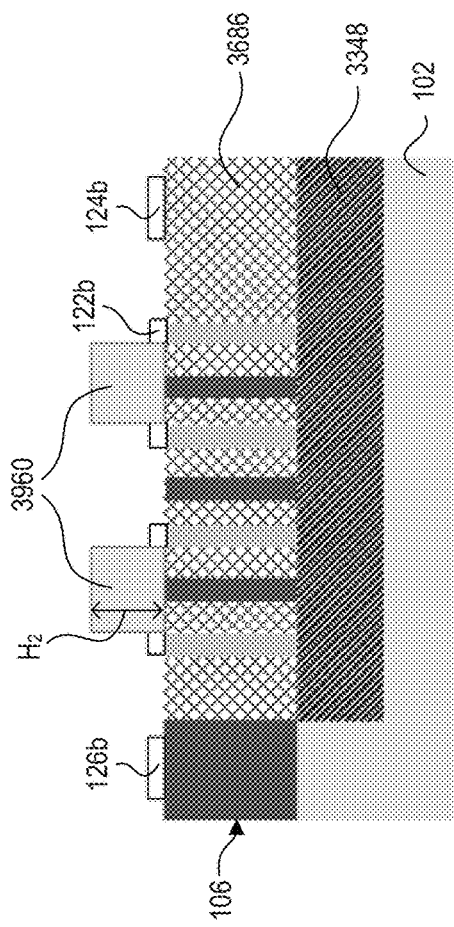

Referring to FIGS. 39A-39B, the formation of patterned layer 3960 can include blanket depositing a layer of organic material on the structure of FIG. 38A and patterning the layer of organic material using photolithography and an etch process (e.g., dry or wet etch). The wet etch process can include etching with an acid, such as sulfuric acid (H$_2$SO$_4$). The dry etch process can include reactive ion etching with chlorine or fluorine based gas. In some embodiments, the dry etch process can include using a gas mixture having hydrogen, nitrogen, and argon. The gas mixture can have about 5% to about 20% hydrogen. The flow rate of hydrogen can range from about 20 sccm to about 100 sccm and the flow rate of nitrogen and argon can range from about 100 sccm to about 400 sccm. The etch process can be carried out for a period of time ranging from about 10 sec to about 90 sec at a temperature ranging from about 10° C. to about 90° C., under a pressure ranging from about 15 mTorr to about 100 mTorr. In some embodiments, patterned layer 3960 can have a vertical dimension (e.g., height) along a Z-axis ranging from about 100 nm to about 10 µm (e.g., about 200 nm, about 300 nm, about 500 nm, about 700 nm, about 900 nm, about 1 µm, about 2 µm, about 5 µm, about 7 µm, or about 9 µm). In some embodiments, the organic material can include a photosensitive polymeric material, such as polyimide or a suitable photoresist.

The formation of patterned layer 3960 can be followed by a thermal treatment of patterned layer 3960 to form modified patterned layer 3960* shown in FIGS. 40A-40B. Prior to the thermal treatment, patterned layer 3960 can have a rectangular cross-section (shown in FIG. 30B), which can be modified to a curved cross-section (shown in FIG. 40B) in modified patterned layer 3960* after the thermal treatment. Curved top surfaces 3960s* of modified patterned layer 3960* can be used to pattern the curved shapes of sensing elements 116 and supporting elements 120 formed in subsequent processes. In some embodiments, curved top surfaces 3960s* can each have a radius of curvature at room temperature ranging from about 100 nm to about 25 mm (e.g., about 200 nm, about 500 nm, about 700 nm, about 1 µm, about 5 µm, about 10 µm, about 20 µm, about 50 µm, about 70 µm, 90 µm, about 100 µm, 250 µm, about 500 µm, about 750 µm, about 1 mm, about 2 mm, about 4 mm, about 10 mm, about 15 mm, or about 20 mm).

The thermal treatment can include annealing patterned layer 3960 in a gaseous environment having air, nitrogen, oxygen, or a combination thereof, at a temperature ranging from about 30° C. to about 500° C. (e.g., about 40° C., about 50° C., about 80° C., about 100° C., about 120° C., about 150° C., about 200° C., about 250° C., about 300° C., about 350° C., about 400° C., or about 450° C.). The annealing process can be performed for a period of time ranging from about 1 min to about 3 hrs (e.g., about 2 mins, about 10 mins, about 30 mins, about 1 hr, about 1.5 hrs, or about 2 hrs).

Figure 41A:
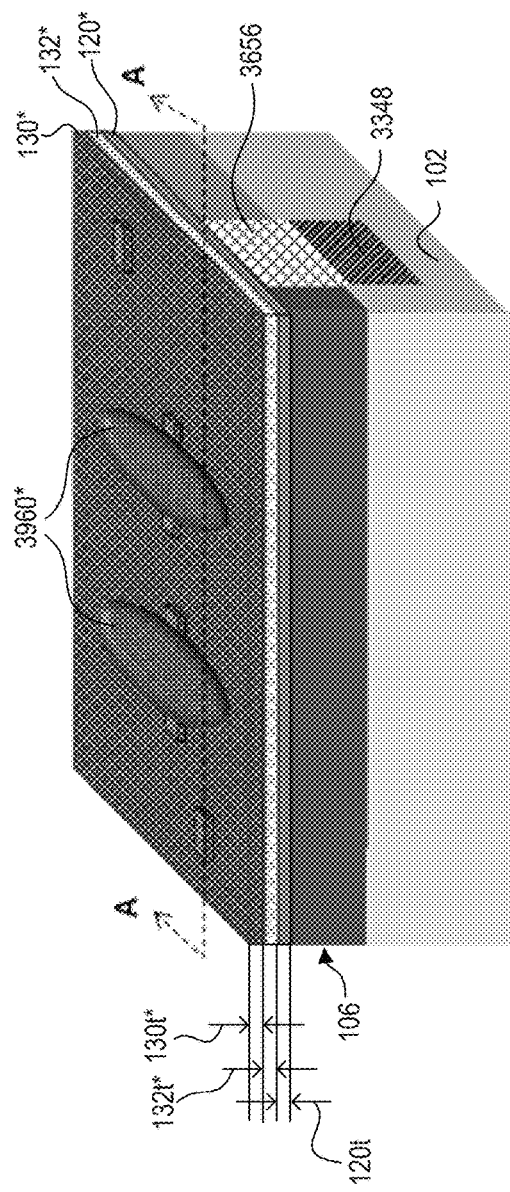
Figure 41B:
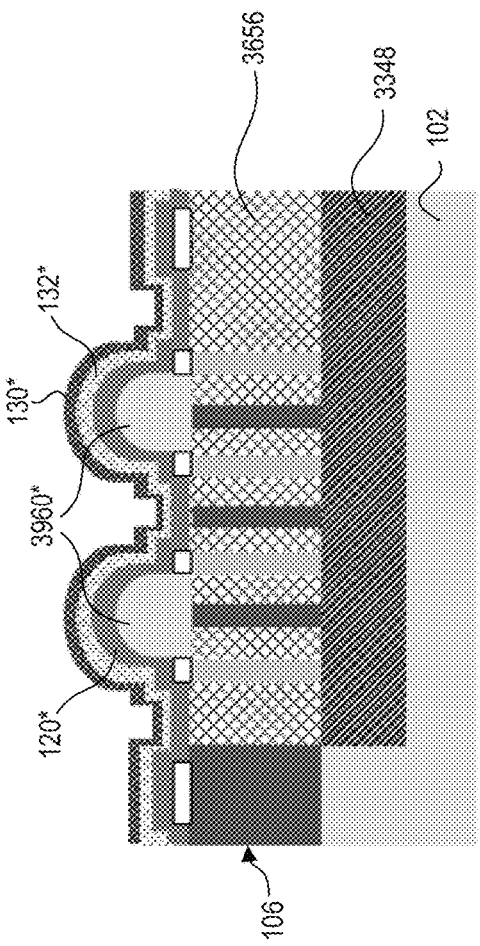

Referring to FIGS. 41A-41B, the formation of modified patterned layer 3960*can be followed by a blanket deposition of supporting element layer 120* on the structure of FIG. 40A, followed by a blanket deposition of second element layer 132* on supporting element layer 120* and then a blanket deposition of first element layer 130* on second element layer 132*. The deposition of supporting element layer 120*, first element layer 130*, and second element layer 132* can each be performed using a suitable conformal deposition process, such as CVD, PECVD, ALD, PEALD, e-beam evaporation, electroplating, electroless plating, or a combination thereof. As shown in FIGS. 41A-41B, supporting element layer 120*, first element layer 130*, and second element layer 132* can each be substantially conformal to its underlying topography. Vertical dimensions 120$t$*, 130$t$*, and 132$t$* can each range from about 100 nm to about 10 µm (e.g., about 200 nm, about 300 nm, about 500 nm, about 700 nm, about 900 nm, about 1 µm, about 2 µm, about 5 µm, about 7 µm, or about 9 µm). Vertical dimensions 120$t$*, 130$t$*, and 132$t$* can be equal to or different from each other.

Supporting element layer 120*, first element layer 130*, and second element layer 132* can be similar to or different from each other in their material composition. In some embodiments, supporting element layer 120*, first element layer 130*, and second element layer 132* can each include a metal, a metal alloy, a semiconductor, or a combination thereof. In some embodiments, supporting element layer 120*, second element layer 132*, and first element layer 130* can each include Si, Ge, Al, Cu, Fe, Ni, Cr, Pt, W, Ti, Ta, Rh, Co, Ag, Sn, AlCu, CuNi, PtRh, NiSi, CoSi, TiAl, aluminum alloy, copper alloy, nickel alloy, stainless steel, or a combination thereof. In some embodiments, the materials of supporting element layer 120*, first element layer 130*, and/or second element layer 132* can be doped with a material, such as silicon, germanium, indium, phosphorus, boron, nitrogen, or a combination thereof and can have different dopant material and doping concentrations from each other.

In some embodiments, first and second element layers 130* and 132* can include temperature sensitive materials with thermal expansion coefficient values ranging from about 5 µm/m-° C. to about 30 µm/m-° C. (e.g., about 6 µm/m-° C., about 8 µm/m-° C., about 10 µm/m-° C., about 12 µm/m-° C., about 15 µm/m-° C., about 17 µm/m-° C., about 20 µm/m-° C., about 22 µm/m-° C., about 23 µm/m-° C., about 25 µm/m-° C., or about 27 µm/m-° C.). There can be a difference of about 0.1 µm/m-° C. to about 25 µm/m-° C. (e.g., about 0.2 µm/m-° C., about 0.5 µm/m-° C., about 0.7 µm/m-° C., about 0.9 µm/m-° C., about 1 µm/m-° C., about 1.5 µm/m-° C., about 3 µm/m-° C., about 5 µm/m-° C., about 7 µm/m-° C., about 10 µm/m-° C., about 12 µm/m-° C., about 15 µm/m-° C., about 17 µm/m-° C., about 20 µm/m-° C., or about 23 µm/m-° C.) between the thermal expansion coefficient values of materials in first and second element layers 130* and 132*. In some embodiments, supporting element layer 120* can have similar material composition and thermal expansion coefficient value as first element layer 130* or second element layer 132*. In some embodiments, supporting element layer 120* can be different from first and second element layers 130* and 132* in material composition and can have a material with a thermal expansion coefficient value that is less than about 5 µm/m-° C. (e.g., about 4 µm/m-° C., about 3 µm/m-° C., about 2 µm/m-° C., about 1 µm/m-° C., about 0.5 µm/m-° C., about 0.2 µm/m-° C., or about 0.1 µm/m-° C.) or substantially equal to zero.

The blanket deposition of first element layer 130* can be followed by the patterning of first and second element layers 130* and 132* to form first and second elements 130 and 132 of sensing element 116 as shown in FIGS. 42A-42B. The patterning of first element layer 130* can include forming patterned photoresist on first element layer 130* using photolithography and selectively removing portions of first element layer 130* not protected by the patterned photoresist to form first elements 130. In some embodiments, the formation of first elements 130 can be followed by selectively removing portions of second element layer 132* not covered by overlying first elements 130 to form second elements 132. Alternatively, in some embodiments, the formation of first elements 130 can be followed by patterning photoresist using photolithography to cover first elements 130 and selectively removing portions of second element layer 132* not covered by overlying first elements 130, which is protected by overlying patterned photoresist. This alternate method of forming second elements 132 can be used to prevent over etching of first element layer 130* when materials of first and second element layers 130* and 132* are similar and/or the etch selectivity between the materials of first and second element layers 130* and 132* is between about 1 and about 10 (e.g., about 2, about 5, or about 8).

The removal process for the portions of first and second element layers 130* and 132* can each include a dry or a wet etch process. In some embodiments, the dry etch process can include using a gas mixture having $CH_4$, $O_2$, $SF_6$, Ar, $H_2$, $Cl_2$, $BCl_3$, $NF_3$, HBr, silane, or a combination thereof; hydrogen bromide (HBr), $O_2$, fluoroform ($CHF_3$), and $Cl_2$; HBr, $O_2$, $Cl_2$, and/or nitrogen ($N_2$) at a pressure of about 45 mTorr to about 60 mTorr; HBr, $O_2$, $Cl_2$, $N_2$, and argon (Ar) at a pressure of about 45 mTorr to about 60 mTorr; or HBr, $O_2$, $Cl_2$, and $N_2$ at a pressure of about 45 mTorr to about 60 mTorr. In some embodiments, the dry etch process can include using a gas mixture having $BCl_3$ and $Cl_2$ with a flow rate of $Cl_2$ between about 0 to 200 sccm and a flow rate of $BCl_3$ between about 10 to 200 sccm. The dry etch process can be performed at an RF power between about 50 to 2000 watts and pressure between about 5 to 200 mT. In some embodiments, the wet etch process can include using an etchant having phosphoric acid, nitric acid, acetic acid, dilute hydrofluoric acid, hydrochloric acid, sulfuric acid, or a combination thereof. The etch process parameters for removing portions of first and second element layers 130* and 132* can be similar to or different from each other.

The formation of second element 132 can be followed by the patterning of supporting element layer 120* to simultaneously form supporting elements 120, first conductive layers 124a and 126a of respective measurement contact pads 124 and 126, and second conductive layers 122a of pad layers 122. The patterning of supporting element layer 120* can include forming patterned photoresist on supporting element layer 120* using photolithography and selectively removing portions of supporting element layer 120* not protected by the patterned photoresist to form supporting elements 120, first conductive layers 124a and 126a, and second conductive layers 122a as shown in FIGS. 43A-43B. The removal process for the portions of supporting element layer 120* can include a dry or a wet etch process. In some embodiments, the dry etch process can include using a gas mixture having $CH_4$, $O_2$, $SF_6$, Ar, $H_2$, $Cl_2$, $BCl_3$, $NF_3$, HBr, silane, or a combination thereof. In some embodiments, the wet etch process can include using an etchant having phosphoric acid, nitric acid, acetic acid, dilute hydrofluoric acid, hydrochloric acid, sulfuric acid, or a combination thereof.

In some embodiments, first and second elements 130 and 132 and supporting elements 120 can be formed in a different sequence of fabrication steps than the sequence of fabrication steps discussed above. For example, instead of forming first elements 130, followed by second elements 132, and then supporting elements 120, supporting elements 120 along with first conductive layers 124a and 126a, and second conductive layers 122a can be formed first, followed by the formation of second elements 132, and then first elements 130. In this example case, the sequence of fabrication steps after the formation of modified patterned layer 3960* can include (i) blanket deposition of supporting element layer 120* on the structure of FIG. 40A, (ii) patterning of supporting element layer 120* using photolithography and an etch process to simultaneously form supporting elements 120, first conductive layers 124a and 126a, and second conductive layers 122a of pad layers 122, (iii) blanket deposition of second element layer 132*, (iv) patterning of second element layer 132* using photolithography and an etch process to form second elements 132, (v) blanket deposition of first element layer 130*, and (vi) patterning of first element layer 130* using photolithography and an etch process to form first elements 130.

In another alternate embodiment, supporting elements along with first conductive layers 124a and 126a, and second conductive layers 122a can be formed first, followed by the formation of first elements 130, and then second elements 132. In this case, the sequence of fabrication steps after the formation of modified patterned layer 3960* can include (i) blanket deposition of supporting element layer 120* on the structure of FIG. 40A, (ii) patterning of supporting element layer 120* using photolithography and an etch process to simultaneously form supporting elements 120, first conductive layers 124a and 126a, and second conductive layers 122a of pad layers 122, (iii) blanket deposition of second element layer 132*, (iv) blanket deposition of first element layer 130* on second element layer 132*, (v) patterning of first element layer 130* using photolithography and an etch process to form first elements 130, and (v) selectively removing portions of second element layer 132* not covered by overlying first elements 130 to form second elements 132.

Referring to FIG. 31, in operation 3135, the modified patterned layer and first and second sacrificial layers are removed. For example, as shown in FIGS. 44A-44B, modified patterned layer 3960* and first and second sacrificial layers 3348 and 3656 can be removed after the formation of sensing elements 116, supporting elements 120, measurement contact pads 124 and 126, and pad layers 122. In some embodiments, modified patterned layer 3960* can be removed using a dry etch process (e.g., reactive ion etching) or a wet etch process (e.g., etchant having sulfuric acid). The removal of modified patterned layer 3960* can be followed by the removal of first and second sacrificial layers 3348 and 3656 using a dry etch process (e.g., reactive ion etching) or a wet etch process (e.g., etchant having dilute hydrofluoric acid).

Additionally or optionally, in some embodiments, the removal of first and second sacrificial layers 3348 and 3656 can be followed by the formation of coating layer 2944 (shown in FIGS. 2-3) on the structure of FIG. 44A. In some embodiments, coating layer 2944 can include one or more self-assembled monolayers or an organic-based material. In some embodiments, coating layer 2944 can be formed by a vapor process (e.g., molecular vapor deposition (MVD) process) or a suitable deposition process for depositing self-assembled monolayers or organic-based material.

The present disclosure provides example structures of a MEMS thermal sensor and example methods for fabricating the same. The MEMS thermal sensor can be configured to measure temperatures based on capacitive sensing technology. In some embodiments, the MEMS thermal sensor can have a pair of capacitive sensing electrodes (e.g., sensing electrodes 104 and 106) with interdigitated electrode fingers (e.g., electrode fingers 108) coupled to curved sensing elements (e.g., sensing elements 116). The sensing elements can be configured to sense temperature and generate mechanical movements in the electrode fingers that can result in a change in capacitance of the sensing electrodes. Based on the capacitance of the sensing electrodes, the MEMS thermal sensor can measure temperatures sensed by the sensing elements.

Compared to sensors with non-curved (e.g., flat) sensing elements, the curved configuration of the sensing elements (e.g., sensing elements 116) disclosed herein enables bidirectional mechanical movements of the electrode fingers (e.g., electrode fingers 108) and as a result, generates a wider range of mechanical movements in lateral directions in response to temperatures sensed by the curved sensing elements (e.g., sensing elements 116). In some embodiments, the range of mechanical movements of each electrode finger coupled to a curved sensing element is increased by about 10% to about 50% (e.g., about 15%, about 20%, about 25%, about 30%, about 35%, about 40%, or 45%) compared to sensors with non-curved sensing elements. In some embodiments, the range of mechanical movements of each electrode finger coupled to a curved sensing element can be from about 1 nm to about 10 μm (e.g., about 5 nm, about 10 nm, about 20 nm, about 50 nm, about 100 nm, about 200 nm, about 500 nm, about 700 nm, about 900 nm, about 1 μm, about 5 μm, about 7 μm, or about 9 μm).

The wider range of mechanical movements can generate a wider range of variation in the capacitance of the sensing electrodes (e.g., sensing electrodes 104 and 106). As a result, the MEMS thermal sensor (e.g., MEMS thermal sensor 100) can sense and measure a wider range of temperatures and be more sensitive to temperature variations based on the capacitance of the sensing electrodes compared to sensors with non-curved sensing elements. In some embodiments, the sensitivity of the MEMS thermal sensor is increased by about 10% to about 60% (e.g., about 15%, about 20%, about 25%, about 30%, about 35%, about 40%, about 45%, about 50%, or about 55%) compared to sensors with non-curved sensing elements.

In some embodiments, a method of fabricating a micro-electro-mechanical system (MEMS) thermal sensor includes forming first and second sensing electrodes with first and second electrode fingers, respectively, on a substrate and forming a patterned layer with a rectangular cross-section between a pair of the first electrode fingers. The first and second electrode fingers are formed in an interdigitated configuration and suspended above the substrate. The method further includes modifying the patterned layer to have a curved cross-section between the pair of the first electrode fingers, forming a curved sensing element on the modified patterned layer to couple to the pair of the first electrode fingers, and removing the modified patterned layer.

In some embodiments, a method of fabricating a device includes forming first and second sensing electrodes with movable first and second electrode fingers, respectively, on a substrate and forming a patterned layer with a curved cross-section between a pair of the first electrode fingers. The first and second electrode fingers are formed in an interdigitated configuration. The method further includes forming a curved supporting element on the patterned layer to couple to the pair of the first electrode fingers, forming a curved sensing element on the curved supporting element, and removing the modified patterned layer.

In some embodiments, a micro-electro-mechanical system (MEMS) device includes a first sensing electrode with a plurality of first electrode fingers and a second sensing electrode with a plurality of second electrode fingers. The pluralities of first and second electrode fingers are arranged in an interdigitated configuration and suspended over a substrate. The MEMS device further includes a curved sensing element coupled to adjacent first electrode fingers of the plurality of first electrode fingers. The curved sensing element is configured to move the adjacent first electrode fingers and change a capacitance between the first and second sensing electrodes in response to a temperature sensed by the curved sensing element. The MEMS device further includes a circuit coupled to the first and second sensing electrodes configured to measure the temperature based on the capacitance between the first and second sensing electrodes.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a micro-electro-mechanical system (MEMS) thermal sensor, comprising:
    forming first and second sensing electrodes with first and second electrode fingers, respectively, on a substrate, wherein the first and second electrode fingers are formed in an interdigitated configuration and suspended above the substrate;
    forming a patterned layer with a rectangular cross-section between a pair of the first electrode fingers;
    modifying the patterned layer to have a curved cross-section between the pair of the first electrode fingers;
    forming a curved sensing element on the modified patterned layer to couple to the pair of the first electrode fingers; and
    removing the modified patterned layer.

2. The method of claim 1, wherein the modifying the patterned layer comprises annealing the patterned layer.

3. The method of claim 1, wherein the forming the first and second sensing electrodes comprises:
    forming a recess in the substrate;
    bonding a wafer to raised regions on a side of the substrate having the recess; and
    thinning down the bonded wafer.

4. The method of claim 3, further comprising:
    forming a first sacrificial layer in the recess;
    forming a second sacrificial layer on the first sacrificial layer and within spaces between the first and second electrode fingers; and
    removing the first and second sacrificial layers after the removing of the modified patterned layer.

5. The method of claim 1, further comprising forming a supporting element between the curved sensing element and the modified patterned layer.

6. The method of claim 1, wherein the forming the curved sensing element comprises:
    forming a first element of the curved sensing element; and
    forming a second element of the curved sensing element after the forming of the first element, wherein the first element is formed on the second element.

7. The method of claim 6, further comprising forming a supporting element after the forming the second element.

8. The method of claim 1, wherein the forming the curved sensing element comprises:
    depositing a second element layer on the modified patterned layer;
    depositing a first element layer on the second element layer;
    patterning the first element layer to form a first element of the curved sensing element; and
    etching the second element layer to form a second element of the curved sensing element, wherein the first element is formed on the second element.

9. The method of claim 1, wherein the forming the patterned layer comprises:
    depositing a layer of polymeric material; and
    patterning the layer of polymeric material.

10. The method of claim 1, further comprising:
    sensing temperature by a temperature sensitive material of the curved sensing element; and
    changing a capacitance between the first and second sensing electrodes by bending the pair of the first electrode fingers in response to the sensed temperature.

11. A method of fabricating a device, comprising:
    forming first and second sensing electrodes with movable first and second electrode fingers, respectively, on a substrate, wherein the first and second electrode fingers are formed in an interdigitated configuration;
    forming a patterned layer with a curved cross-section between a pair of the first electrode fingers;
    forming a curved supporting element on the patterned layer to couple to the pair of the first electrode fingers;
    forming a curved sensing element on the curved supporting element; and
    removing the patterned layer.

12. The method of claim 11, wherein the forming the patterned layer with the curved cross-section comprises:
    forming a patterned layer with a rectangular cross-section between the pair of the first electrode fingers; and
    annealing the patterned layer with the rectangular cross-section.

13. The method of claim 11, wherein the forming the curved sensing element on the curved supporting element comprises:
    depositing a second element layer on the curved supporting element;
    depositing a first element layer on the second element layer;
    patterning the first element layer to form a first element of the curved sensing element; and
    etching the second element layer to form a second element of the curved sensing element, wherein the first element is formed on the second element.

14. The method of claim 11, wherein the forming the curved sensing element on the curved supporting element comprises:
    depositing a second element layer on the curved supporting element;

patterning the second element layer to form a second element of the curved sensing element;

depositing a first element layer on the second element; and patterning the first element layer to form a first element of the curved sensing element.

15. The method of claim 11, wherein the forming the first and second sensing electrodes comprises:

forming a recess in the substrate;

bonding a wafer to raised regions on a side of the substrate having the recess; and thinning down the bonded wafer.

16. The method of claim 11, further comprising forming buffer layers between the curved supporting element and the first electrode fingers.

17. A method, comprising:

forming a sensing electrode with movable electrode fingers on a substrate;

forming a patterned layer with a curved cross-section between a pair of the electrode fingers;

forming a curved supporting element on the patterned layer;

forming a curved sensing element on the curved supporting element; and removing the patterned layer.

18. The method of claim 17, wherein the forming the patterned layer with the curved cross-section comprises:

forming a patterned layer with a rectangular cross-section between the pair of the electrode fingers; and annealing the patterned layer with the rectangular cross-section.

19. The method of claim 17, wherein the forming the curved sensing element on the curved supporting element comprises:

forming a first element of the curved sensing element; and forming a second element of the curved sensing element after the forming the first element.

20. The method of claim 17, wherein the forming the curved sensing element on the curved supporting element comprises:

forming a first element with a first thermal expansion coefficient value; and forming a second element with a second thermal expansion coefficient different from the first thermal expansion coefficient value.

* * * * *